US009673812B2

(12) United States Patent
Takano

(10) Patent No.: US 9,673,812 B2
(45) Date of Patent: Jun. 6, 2017

(54) GATE DRIVER AND POWER MODULE EQUIPPED WITH SAME

(71) Applicant: Panasonic Intellectual Property Management Co., Ltd., Osaka (JP)

(72) Inventor: Yoh Takano, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 147 days.

(21) Appl. No.: 14/607,111

(22) Filed: Jan. 28, 2015

(65) Prior Publication Data
US 2015/0137871 A1    May 21, 2015

Related U.S. Application Data

(63) Continuation of application No. PCT/JP2014/002646, filed on May 20, 2014.

(30) Foreign Application Priority Data

Jun. 4, 2013 (JP) .................................. 2013-117662

(51) Int. Cl.
    *H03B 1/00*    (2006.01)
    *H03K 3/00*    (2006.01)
    (Continued)

(52) U.S. Cl.
    CPC ............ *H03K 17/687* (2013.01); *H02M 1/08* (2013.01); *H03K 17/063* (2013.01);
    (Continued)

(58) Field of Classification Search
    CPC .. H03K 17/687; H03K 17/063; H03K 17/691; H03K 2217/0081; H02M 1/08; H02M 1/38
    (Continued)

(56) References Cited

U.S. PATENT DOCUMENTS 6,271,708 B1    8/2001    Hoshi et al.
6,429,701 B2 *    8/2002    Karaki ................. H03K 17/166
                                             327/110

(Continued)

FOREIGN PATENT DOCUMENTS

JP      5-244763      9/1993
JP      5-244765      9/1993

(Continued)

OTHER PUBLICATIONS

International Search Report of PCT application No. PCT/JP2014/002646 dated Jul. 29, 2014.

*Primary Examiner* — Lincoln Donovan
*Assistant Examiner* — Diana J Cheng
(74) *Attorney, Agent, or Firm* — McDermott Will & Emery LLP

(57) ABSTRACT

A gate driver that drives a field-effect transistor on the basis of an input signal includes a comparator that compares an applied voltage applied between the drain and the source of a field-effect transistor to a reference voltage for detecting noise occurring between the drain and the source of the field-effect transistor, and a gate voltage switching circuit that, if the field-effect transistor is off, switches the voltage applied between the gate and the source of the field-effect transistor from a first voltage to a second voltage when the output of the comparator transitions from a state indicating that the applied voltage between the drain and the source is less than the reference voltage to a state indicating that the applied voltage between the drain and the source is equal to or greater than the reference voltage.

12 Claims, 20 Drawing Sheets

(51) Int. Cl.
*H03K 17/687* (2006.01)
*H02M 1/08* (2006.01)
*H03K 17/06* (2006.01)
*H03K 17/691* (2006.01)
*H02M 1/38* (2007.01)

(52) U.S. Cl.
CPC ............ *H03K 17/691* (2013.01); *H02M 1/38* (2013.01); *H03K 2217/0081* (2013.01)

(58) Field of Classification Search
USPC .................................................. 327/108–112
See application file for complete search history.

(56) References Cited

U.S. PATENT DOCUMENTS

| | | | |
|---|---|---|---|
| 9,425,786 B2 * | 8/2016 | Zoels | ...................... H02M 1/08 |
| 2004/0227193 A1 | 11/2004 | Lee et al. | |
| 2010/0141304 A1 | 6/2010 | Miyazaki | |
| 2012/0057386 A1 | 3/2012 | Adachi et al. | |
| 2012/0306545 A1 | 12/2012 | Machida et al. | |

FOREIGN PATENT DOCUMENTS

| | | |
|---|---|---|
| JP | 9-047015 | 2/1997 |
| JP | 2000-059189 | 2/2000 |
| JP | 2000-139071 | 5/2000 |
| JP | 2004-364275 | 12/2004 |
| JP | 2010-509771 | 3/2010 |
| JP | 2013-013044 | 1/2013 |
| WO | 2008/057438 | 5/2008 |
| WO | 2009/004715 | 1/2009 |
| WO | 2010/125819 | 11/2010 |
| WO | 2012/039174 | 3/2012 |

* cited by examiner

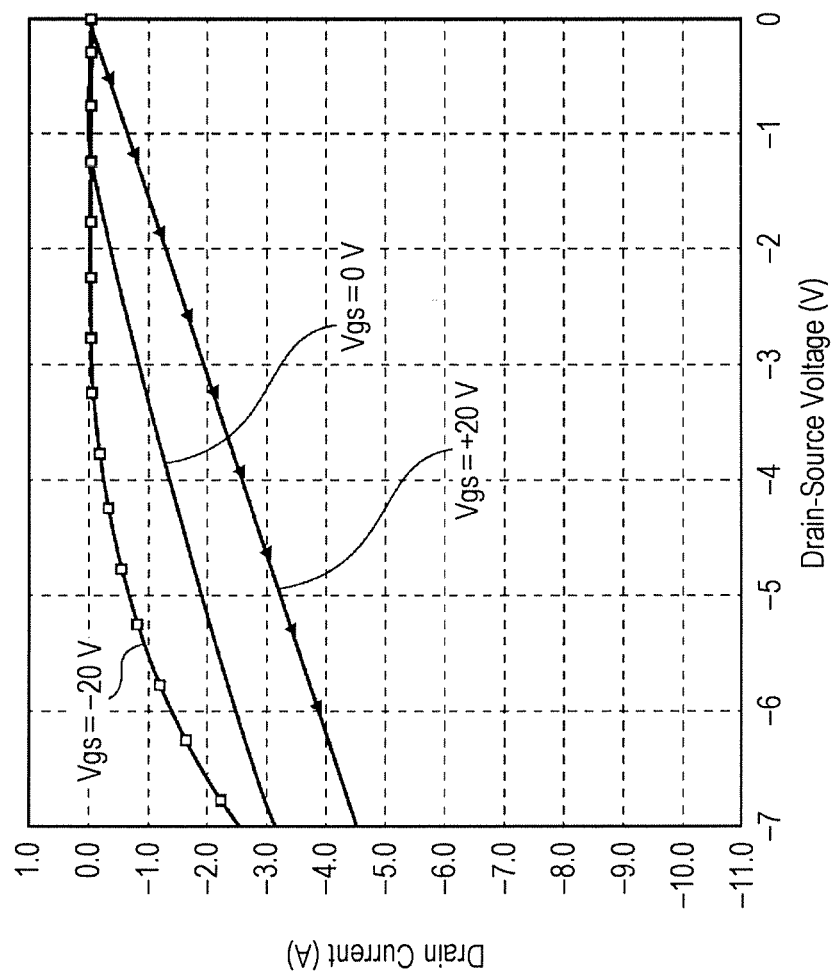
FIG. 20 - PRIOR ART

GATE DRIVER AND POWER MODULE EQUIPPED WITH SAME

BACKGROUND

1. Technical Field

The present disclosure relates to a gate driver that drives a field-effect transistor, and a power module equipped with the same.

2. Description of the Related Art

Silicon carbide (SiC) is a semiconductor material with a larger bandgap compared to silicon (Si), and is applied to power devices. Power devices that use SiC include, for example, the metal-insulator-semiconductor field-effect transistor (MISFET) (see International Publication No. 2010/125819 and Japanese Unexamined Patent Application Publication No. 2010-509771, for example). The metal-oxide-semiconductor field-effect transistor (MOSFET) is one type of MISFET.

International Publication No. 2010/125819 discloses a field-effect transistor equipped with a channel layer. In the field-effect transistor, when the gate-source voltage is less than a gate threshold voltage, a current flows from the source to the drain if the drain-source voltage is a negative voltage. At this point, since the current passes through the channel layer, the transistor is called a channel diode. International Publication No. 2010/125819 discloses using a channel diode as a flyback diode. Note that in this specification, the drain-source voltage refers to the voltage of the drain with respect to the source. Also, the gate-source voltage refers to the voltage of the gate with respect to the source.

In a field-effect transistor, on/off control is conducted using a voltage applied between the gate and the source. When switching a field-effect transistor from the on state to the off state, suppressing misfiring due to noise and the like by applying a negative voltage between the gate and the source has been proposed (see Japanese Unexamined Patent Application Publication No. 5-244765 and International Publication No. 2009/004715, for example).

International Publication No. 2010/125819, Japanese Unexamined Patent Application Publication No. 2010-509771, Japanese Unexamined Patent Application Publication No. 5-244765, and International Publication No. 2009/004715 are examples of related art.

SUMMARY

In a gate driver that drives a field-effect transistor, it is desirable to moderate lowered conduction performance of the channel diode of the field-effect transistor, and suppress misfiring of the field-effect transistor.

One non-limiting and exemplary embodiment provides a gate driver capable of moderating lowered conduction performance of a channel diode, and in addition, suppressing misfiring of a field-effect transistor.

In one general aspect, the techniques disclosed here feature a gate driver that drives a field-effect transistor on the basis of an input signal, including a comparator and a gate voltage switching circuit. The comparator compares an applied voltage applied between a drain and a source of the field-effect transistor to a reference voltage for detecting noise occurring between the drain and the source of the field-effect transistor. If the input signal indicates an instruction to turn off the field-effect transistor, and the field-effect transistor is off, the gate voltage switching circuit switches a voltage applied between a gate and the source of the field-effect transistor from a first voltage to a second voltage when the output of the comparator transitions from a state indicating that the applied voltage between the drain and the source is less than the reference voltage to a state indicating that the applied voltage between the drain and the source is equal to or greater than the reference voltage. Provided that Vth is the threshold voltage of the field-effect transistor, V1 is the first voltage, and V2 is the second voltage, the relationship Vth>V1>V2 is satisfied, and in addition, the second voltage is a negative voltage.

Note that these general or specific aspects may also be realized by a system, method, integrated circuit, computer program, or recording medium, and may also be realized by an arbitrary combination of a system, device, method, integrated circuit, computer program, and recording medium.

According to the one aspect, in a gate driver in accordance with the present disclosure, it becomes possible to moderate lowered conduction performance of a channel diode, and in addition, suppress misfiring of a field-effect transistor. Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 20 is a diagram illustrating IV characteristics of the FET disclosed in Japanese Unexamined Patent Application Publication No. 2010-509771.

DETAILED DESCRIPTION (Findings that Form the Basis of the Disclosure)

Figure 19:
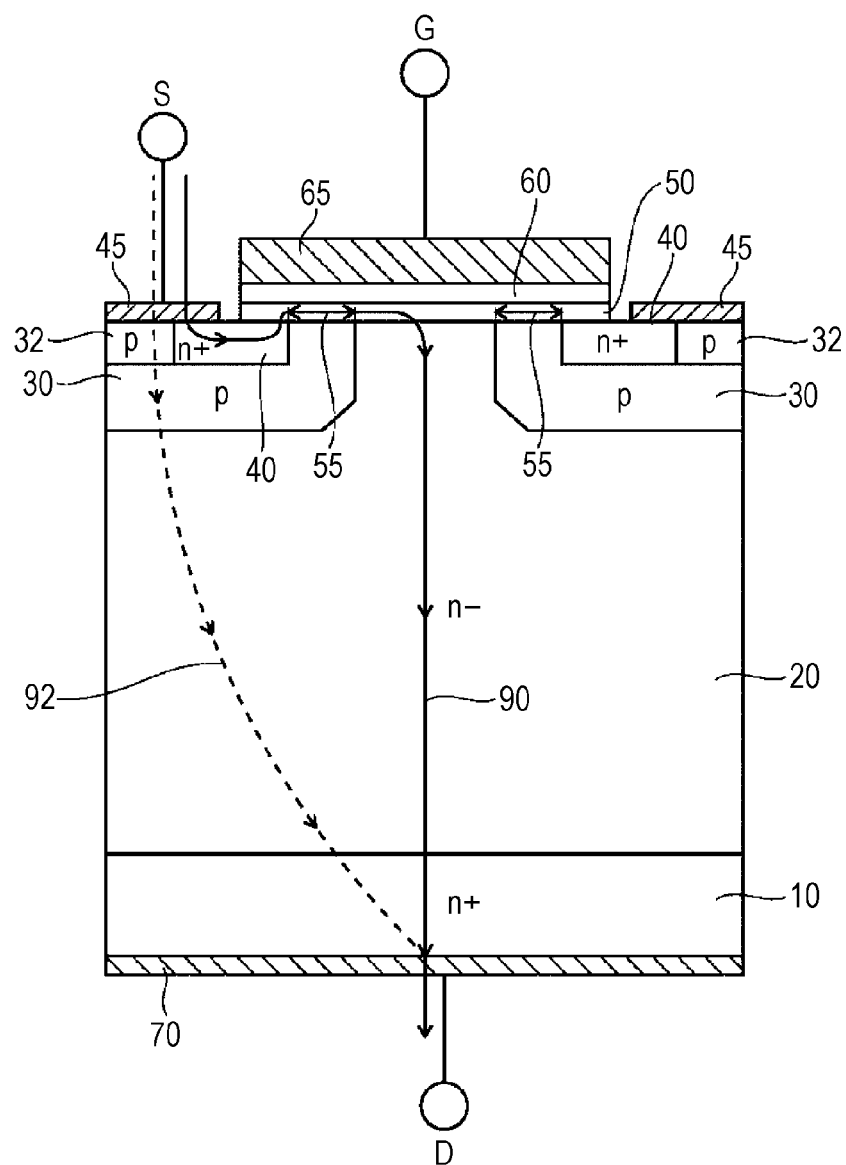
FIG. 19 is a schematic diagram of a FET provided with a channel layer.

FIG. 19 illustrates a schematic diagram of a FET provided with a channel layer. The FET 102L is provided with a substrate 10, a drift region 20, a body region 30, a body contact region 32, a source region 40, a source electrode 45, a channel layer 50, a gate insulating layer 60, a gate electrode 65, and a drain electrode 70. Among the channel layer 50, the region positioned between the body region 30 and the gate electrode 65 functions as a channel region 55. The substrate 10, drift region 20, body region 30, body contact region 32, source region 40, and channel layer 50 are all made of SiC. In the FET 102L, if the voltage Vds applied between the drain and the source is a positive voltage, and if the voltage applied between the gate and the source is equal to or greater than a gate threshold voltage Vth, a current flows from the drain electrode 70 to the source electrode 45 via the channel layer 50. On the other hand, in the FET 102L, if the voltage Vds applied between the drain and the source is a negative voltage, and if the voltage applied between the gate and the source is less than the gate threshold voltage Vth, a current flows from the source electrode 45 to the drain electrode 70 via the channel layer 50. At this point, the channel layer 50 functions as a channel diode. The path of current 90 when the channel layer 50 is functioning as a channel diode differs from the path of current 92 that flows through the parasitic body diode. Note that the parasitic body diode is made up of the p-type body region 30 and the n-type drift region 20. According to this FET 102L, since current flows via the channel layer 50 rather than the body diode, the turn-on voltage of the diode may be decreased. As a result, conduction loss of the FET 102L may be decreased.

In order to suppress misfiring in a FET provided with such a channel layer, the inventor investigated applying a negative voltage between the gate and the source while the FET is off.

However, as the gate-source voltage is varied in the negative direction from zero, the conduction performance of the channel diode falls. This phenomenon will be described in detail hereinafter.

FIG. 20 is a diagram illustrating IV characteristics of the FET disclosed in Japanese Unexamined Patent Application Publication No. 2010-509771. The horizontal axis of FIG. 20 indicates the voltage Vds applied between the drain and the source. Also, the vertical axis of FIG. 20 indicates the drain current. Herein, since current flows from the source towards the drain, the drain current is indicated as a negative value. Also illustrated are the IV characteristics when respectively applying +20 V, 0 V, and −20 V between the gate and the source of the FET.

FIG. 20 demonstrates that even when the drain-source voltage Vds is the same, if the gate-source voltage Vgs is a negative voltage, the drain current becomes smaller. This means that the conduction performance of the channel diode falls as the gate-source voltage Vgs becomes larger in the negative direction.

Also, FIG. 20 demonstrates that since the drain current that flows when the gate-source voltage Vgs is 0 V rises at a drain-source voltage Vds of approximately −1.25 V, the current is flowing through the channel diode. On the other hand, FIG. 20 also demonstrates that since the drain current that flows when the gate-source voltage Vgs is −20 V rises at a drain-source voltage Vds of approximately −3 V, the current is flowing through the parasitic body diode. There are reports that if current flows through the body diode of a FET, the silicon carbide crystal degrades (see International Publication No. 2010/125819 and Japanese Unexamined Patent Application Publication No. 2010-509771).

The above thus demonstrates that in the case of using the channel diode of a FET as a flyback diode, in the state in which a negative voltage of large absolute value is applied between the gate and the source of the FET, there is a risk that the conduction performance of the flyback diode will fall, and the silicon carbide crystal will also degrade.

In the gate driver disclosed in this specification, when the FET is off, a first voltage V1 is normally applied between the gate and the source. Provided that Vth is the gate threshold voltage of the FET, the relationship Vth>V1 is satisfied. Also, when there is a higher likelihood of FET misfiring due to noise occurring between the drain and the source of the FET, the gate driver switches the gate-source voltage of the FET from the first voltage V1 to a second voltage V2. Herein, the relationship V1>V2 is satisfied, and V2 is a negative voltage. Consequently, even if the gate-source voltage rises due to the effects of noise occurring between the drain and the source of the FET, it is possible to keep the gate voltage from becoming equal to or greater than the gate threshold voltage. In addition, when there is a lower likelihood of FET misfiring, the gate driver switches the gate-source voltage of the FET from the second voltage V2 to the first voltage V1. A lower likelihood of misfiring may be judged by the detection of a decrease in noise, or the detection of the elapse of a fixed time since noise occurred, for example.

In this way, by suitably selecting the first and the second voltages, it becomes possible to moderate lowered conduction performance of the channel diode of the FET, and in addition, suppress misfiring of the FET.

In addition, in the case of using the channel diode of the FET as a flyback diode, a current does not necessarily flow through the channel diode continuously while the FET is off. Under conditions in which a current does not flow through the channel diode, even if the second voltage is applied between the gate and the source of the FET, the problem of lowered conduction performance does not even occur in the first place. However, with the method of continuously applying a negative current of large absolute value between the gate and the source of the FET while the FET is off, a negative current of large absolute value is applied between the gate and the source of the FET even when a current flows through the channel diode. For this reason, a current flows through the channel diode in a state of lowered conduction performance.

In contrast, according to the present gate driver, when there is no overlap between the period when a current flows through the channel diode of the FET and the period of a higher likelihood of misfiring, the problem of lowered conduction performance may be prevented from occurring in the first place. Also, according to the present gate driver, even when there is overlap between the period when a current flows through the channel diode of the FET and the period of a higher likelihood of misfiring, the problem of lowered conduction performance may be minimized.

A gate driver according to an aspect of the present disclosure is a gate driver that drives a field-effect transistor on the basis of an input signal, and is equipped with a comparator and a gate voltage switching circuit. The comparator compares an applied voltage applied between the drain and the source of the field-effect transistor to a reference voltage for detecting noise occurring between the drain and the source of the field-effect transistor. If the input signal indicates an instruction to turn off the field-effect transistor, and the field-effect transistor is off, the gate voltage switching circuit switches the voltage applied between the gate and the source of the field-effect transistor from a first voltage to a second voltage when the output of the comparator transitions from a state indicating that the applied voltage between the drain and the source is less than the reference voltage to a state indicating that the applied voltage between the drain and the source is equal to or greater than the reference voltage. Provided that Vth is the threshold voltage of the field-effect transistor, V1 is the first voltage, and V2 is the second voltage, the relationship Vth>V1>V2 is satisfied, and in addition, the second voltage is a negative voltage.

A gate driver according to another aspect of the present disclosure may be configured so that the gate voltage switching circuit additionally, if the input signal indicates an instruction to turn off the field-effect transistor, and the field-effect transistor is off, switches the voltage applied between the gate and the source of the field-effect transistor from the second voltage to a third voltage when the output of the comparator transitions from a state indicating that the applied voltage between the drain and the source is equal to or greater than the reference voltage to a state indicating that the applied voltage between the drain and the source is less than the reference voltage. Provided that V3 is the third voltage, the relationship Vth>V3>V2 is satisfied.

A gate driver according to another aspect of the present disclosure may be configured so that the third voltage is equal to the first voltage, and the gate voltage switching circuit includes a first switch inserted on a line joining the gate of the field-effect transistor to a first power supply that generates the first voltage, a second switch inserted on a line joining the gate of the field-effect transistor to a second power supply that generates the second voltage, and a switch control circuit that, if the input signal indicates an instruction to turn off the field-effect transistor, and the field-effect transistor is off, turns on the first switch and turns off the second switch if the output of the comparator indicates that the applied voltage between the drain and the source is less than the reference voltage, and turns off the first switch and turns on the second switch if the output of the comparator indicates that the applied voltage between the drain and the source is equal to or greater than the reference voltage.

A gate driver according to another aspect of the present disclosure may be configured so that the first voltage V1 and the third voltage V3 satisfy a relationship V3<V1, and the gate voltage switching circuit includes a first switch inserted on a line joining the gate and the source of the field-effect transistor, a second switch inserted on a line joining the gate of the field-effect transistor to a second power supply that generates the second voltage, and a switch control circuit that, if the input signal indicates an instruction to turn off the field-effect transistor, and the field-effect transistor is off, (a) if the output of the comparator indicates that the applied voltage between the drain and the source is less than the reference voltage, and in addition, the voltage between the gate and the source of the field-effect transistor is a more positive voltage than the first voltage, turns off the first switch and turns on the second switch, and if the output of the comparator indicates that the applied voltage between the drain and the source is less than the reference voltage, and in addition, the voltage between the gate and the source of the field-effect transistor is included in a range from the first voltage to the third voltage, turns off the first switch and turns off the second switch, (b) if the output of the comparator indicates that the applied voltage between the drain and the source is equal to or greater than the reference voltage, turns off the first switch and turns on the second switch, and (c) if the output of the comparator indicates that the applied voltage between the drain and the source is less than the reference voltage, and in addition, the voltage between the gate and the source of the field-effect transistor is included in a range from the third voltage to the second voltage, turns on the first switch and turns off the second switch.

A gate driver according to another aspect of the present disclosure may additionally include a period detecting unit that detects whether or not a predetermined period has elapsed since the output of the comparator transitioned from a state indicating that the applied voltage between the drain and the source of the field-effect transistor is less than the reference voltage to a state indicating that the applied voltage between the drain and the source is equal to or greater than the reference voltage, the gate voltage switching circuit may additionally, if the input signal indicates an instruction to turn off the field-effect transistor, and the field-effect transistor is off, switch the voltage applied between the gate and the source of the field-effect transistor from the second voltage to a third voltage when a detection result of the period detecting unit transitions from a state in which the predetermined period has not elapsed to a state in which the predetermined period has elapsed, and provided that V3 is the third voltage, the relationship Vth>V3>V2 may be satisfied.

A gate driver according to another aspect of the present disclosure may be configured so that the first voltage and the third voltage are equal, and the gate voltage switching circuit includes a first switch inserted on a line joining the gate of the field-effect transistor to a first power supply that generates the first voltage, a second switch inserted on a line joining the gate of the field-effect transistor to a second power supply that generates the second voltage, and a switch control circuit that, if the input signal indicates an instruction to turn off the field-effect transistor, and the field-effect transistor is off, turns on the first switch and turns off the second switch if the output of the comparator indicates that the applied voltage between the drain and the source is less than the reference voltage, and turns off the first switch and turns on the second switch when the detection result of the period detecting unit transitions from a state in which the predetermined period has not elapsed to a state in which the predetermined period has elapsed.

A gate driver according to another aspect of the present disclosure may be configured so that the first voltage V1 and the third voltage V3 satisfy a relationship V3<V1, and the gate voltage switching circuit includes a first switch inserted on a line joining the gate and the source of the field-effect transistor, a second switch inserted on a line joining the gate of the field-effect transistor to a second power supply that generates the second voltage, and a switch control circuit that, if the input signal indicates an instruction to turn off the field-effect transistor, and the field-effect transistor is off, (a) if the output of the comparator indicates that the applied voltage between the drain and the source is less than the reference voltage, and in addition, the voltage between the gate and the source of the field-effect transistor is a more positive voltage than the first voltage, turns off the first switch and turns on the second switch, and if the output of the comparator indicates that the applied voltage between the drain and the source is less than the reference voltage, and in addition, the voltage between the gate and the source of the field-effect transistor is included in a range from the first voltage to the third voltage, turns off the first switch and turns off the second switch, (b) if a detection result of the period detecting unit indicates a state in which the predetermined period has not elapsed, turns off the first switch and turns on the second switch, and (c) if a detection result of the period detecting unit indicates a state in which the predetermined period has elapsed, and in addition, the voltage between the gate and the source of the field-effect transistor is included in a range from the third voltage to the second voltage, turns on the first switch and turns off the second switch.

A gate driver according to another aspect of the present disclosure may additionally include a high-pass filter, inserted on a pathway that transmits the applied voltage between the drain and the source of the field-effect transistor from the field-effect transistor to the comparator, that transmits the applied voltage between the drain and the source of the field-effect transistor to the comparator only if a time rate of change of the applied voltage between the drain and the source of the field-effect transistor is equal to or greater than a predetermined value.

A gate driver according to another aspect of the present disclosure may additionally include a period detecting unit that detects whether or not a predetermined period has elapsed since the output of the comparator transitioned from a state indicating that the applied voltage between the drain and the source of the field-effect transistor is less than the reference voltage to a state indicating that the applied voltage between the drain and the source is equal to or greater than the reference voltage, and the gate voltage switching circuit may additionally, if the input signal indicates an instruction to turn off the field-effect transistor, and the field-effect transistor is off, switch the voltage applied between the gate and the source of the field-effect transistor from the second voltage to a third voltage when a detection result of the period detecting unit transitions from a state in which the predetermined period has not elapsed to a state in which the predetermined period has elapsed, and provided that V3 is the third voltage, the relationship Vth>V3>V2 may be satisfied.

A gate driver according to another aspect of the present disclosure may additionally include a current detecting unit that detects a drain current of the field-effect transistor, and a switch, inserted on a pathway that transmits the applied voltage between the drain and the source of the field-effect transistor from the field-effect transistor to the comparator, that transmits the applied voltage between the drain and the source of the field-effect transistor to the comparator if the field-effect transistor is off, and transmits a detection result of the current detecting unit to the comparator if the field-effect transistor is on.

A power module according to an aspect of the present disclosure includes a gate driver according to an aspect of the present disclosure, and the field-effect transistor.

A power module according to another aspect of the present disclosure may be configured so that the field-effect transistor is provided with a channel layer, and the field-effect transistor functions as a diode that allows current to flow from the source to the drain via the channel layer when a negative voltage is applied between the drain and the source while a negative voltage is being applied between the gate and the source.

Hereinafter, exemplary embodiments of the present disclosure will be described with reference to the drawings.

First Embodiment (Configuration)

Figure 1:
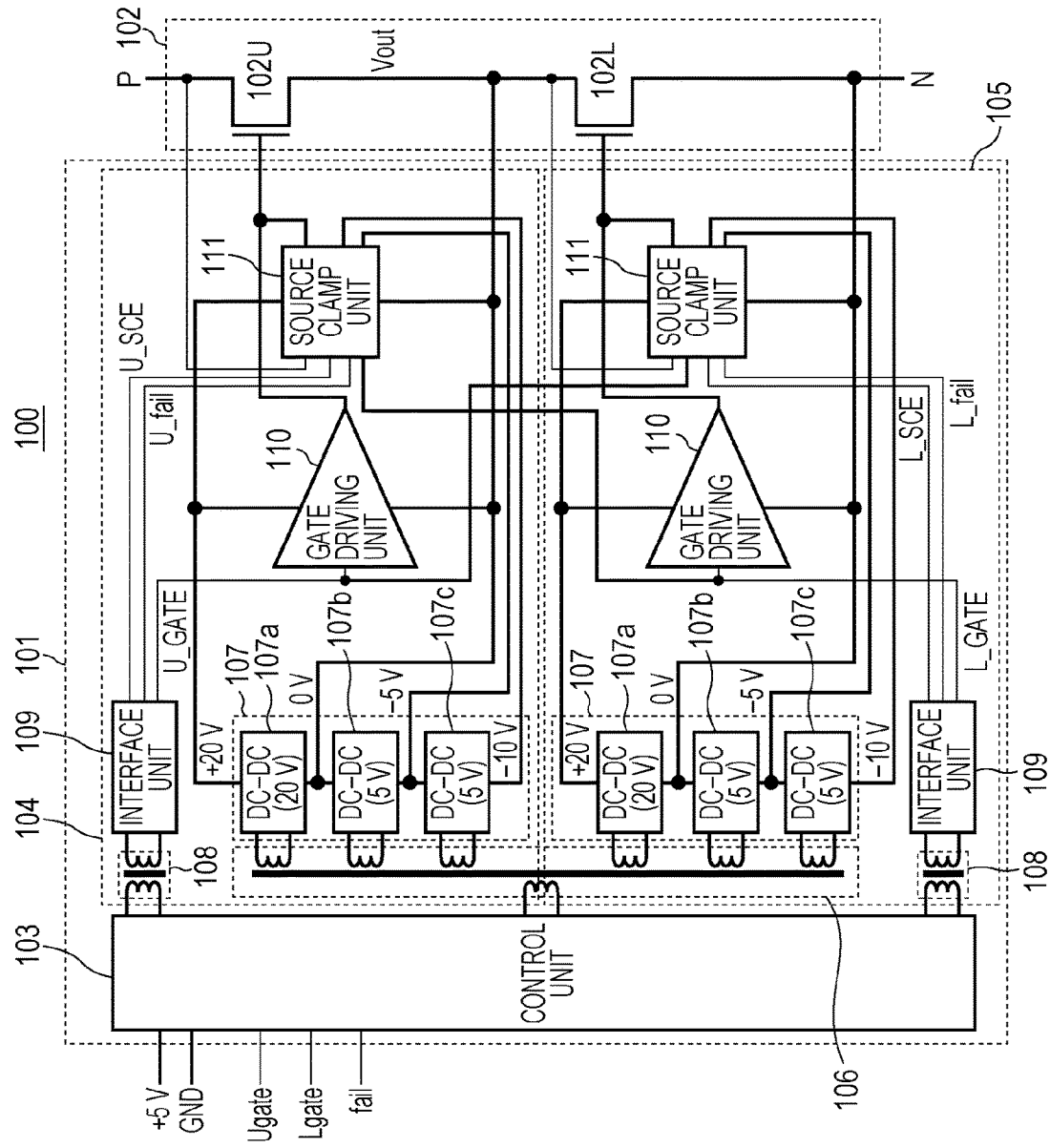
FIG. 1 is a circuit diagram illustrating an overall configuration of a power module according to the first embodiment.

FIG. 1 is a diagram illustrating an overall configuration of a power module according to the first embodiment.

The power module 100 is made up of a gate driver 101 and a bridge circuit 102.

The bridge circuit 102 is made up of an upper arm FET 102U and a lower arm FET 102L. The FET in FIG. 19 is adopted as the FETs 102U and 102L.

The gate driver 101 is made up of a control unit 103, an upper arm driver 104, and a lower arm driver 105. The upper arm driver 104 is made up of a power supply transformer 106, an internal power supply 107, an isolation transformer 108, an interface unit 109, a gate driving unit 110, and a source clamp unit 111. The lower arm driver 105 has the same configuration as the upper arm driver 104.

The control unit 103 is connected to a +5 V power supply and GND. The control unit 103 generates a +5 V pulse, and outputs the generated pulse to the power supply transformer 106. Each internal power supply 107 is made up of DC-DC converters 107a, 107b, and 107c. The DC-DC converter 107a generates a +20 V DC voltage from the pulse input by the power supply transformer 106. The DC-DC converters 107b and 107c each generate a +5 V DC voltage from the pulse input by the power supply transformer 106. The DC-DC converter 107a functions as a positive voltage power supply (+20 V). The DC-DC converter 107b functions as a first power supply (−5 V). The DC-DC converters 107b and 107c function as a second power supply (−10 V).

Also, an upper arm control signal Ugate and a lower arm control signal Lgate are input into the control unit 103. The control unit 103 transmits the upper arm control signal Ugate to the interface unit 109 via the isolation transformer 108 of the upper arm driver 104. Also, the control unit 103 transmits the lower arm control signal Lgate to the interface unit 109 via the isolation transformer 108 of the lower arm driver 105.

Additionally, an overcurrent detection signal U_fail is input into the control unit 103 from the interface unit 109 via the isolation transformer 108 of the upper arm driver 104. Also, an overcurrent detection signal L_fail is input into the control unit 103 from the interface unit 109 via the isolation transformer 108 of the lower arm driver 105. The control unit 103 outputs the OR of the overcurrent detection signals U_fail and L_fail as an overcurrent detection signal fail.

The interface unit 109 of the upper arm driver 104 generates a gate driving signal U_GATE, which is the non-inverted signal of the upper arm control signal Ugate, and a source clamp enable signal U_SCE, which is the inverted signal of the upper arm control signal Ugate. Similarly, the interface unit 109 of the lower arm driver 105 generates a gate driving signal L_GATE, which is the non-inverted signal of the lower arm control signal Lgate, and a source clamp enable signal L_SCE, which is the inverted signal of the lower arm control signal Lgate.

A positive voltage (+20 V) is supplied to each gate driving unit 110. When the gate driving signal U_GATE indicates an instruction to turn on the FET 102U (in the present embodiment, high level), the gate driving unit 110 of the upper arm driver 104 applies a positive voltage (+20 V) between the gate and the source of the FET 102U, thereby fulfilling the role of turning on the FET 102U. Similarly, when the gate driving signal L_GATE indicates an instruction to turn on the FET 102L (in the present embodiment, high level), the gate driving unit 110 of the lower arm driver 105 applies a positive voltage (+20 V) between the gate and the source of the FET 102L, thereby fulfilling the role of turning on the FET 102L.

The positive voltage (+20 V), the first voltage (−5 V), and the second voltage (−10 V) are supplied to each source clamp unit 111. When the source clamp enable signal U_SCE indicates an instruction to turn off the FET 102U, the source clamp unit 111 of the upper arm driver 104 applies the first voltage (−5 V) or the second voltage (−10 V) between the gate and the source of the FET 102U, thereby fulfilling the role of turning off the FET 102U. Similarly, when the source clamp enable signal L_SCE indicates an instruction to turn off the FET 102L, the source clamp unit 111 of the lower arm driver 105 applies the first voltage (−5 V) or the second voltage (−10 V) between the gate and the source of the FET 102L, thereby fulfilling the role of turning off the FET 102L. Note that in the present embodiment, the case of a source clamp enable signal indicating an instruction to turn off a FET corresponds to the case in which the source clamp enable signal is at high level. Whether each source clamp unit 111 applies the first voltage (−5 V) or the second voltage (−10 V) is decided according to the likelihood of misfiring of the FETs 102U and 102L.

Hereinafter, a configuration and operation of the source clamp unit 111 will be described in detail.

Figure 2:
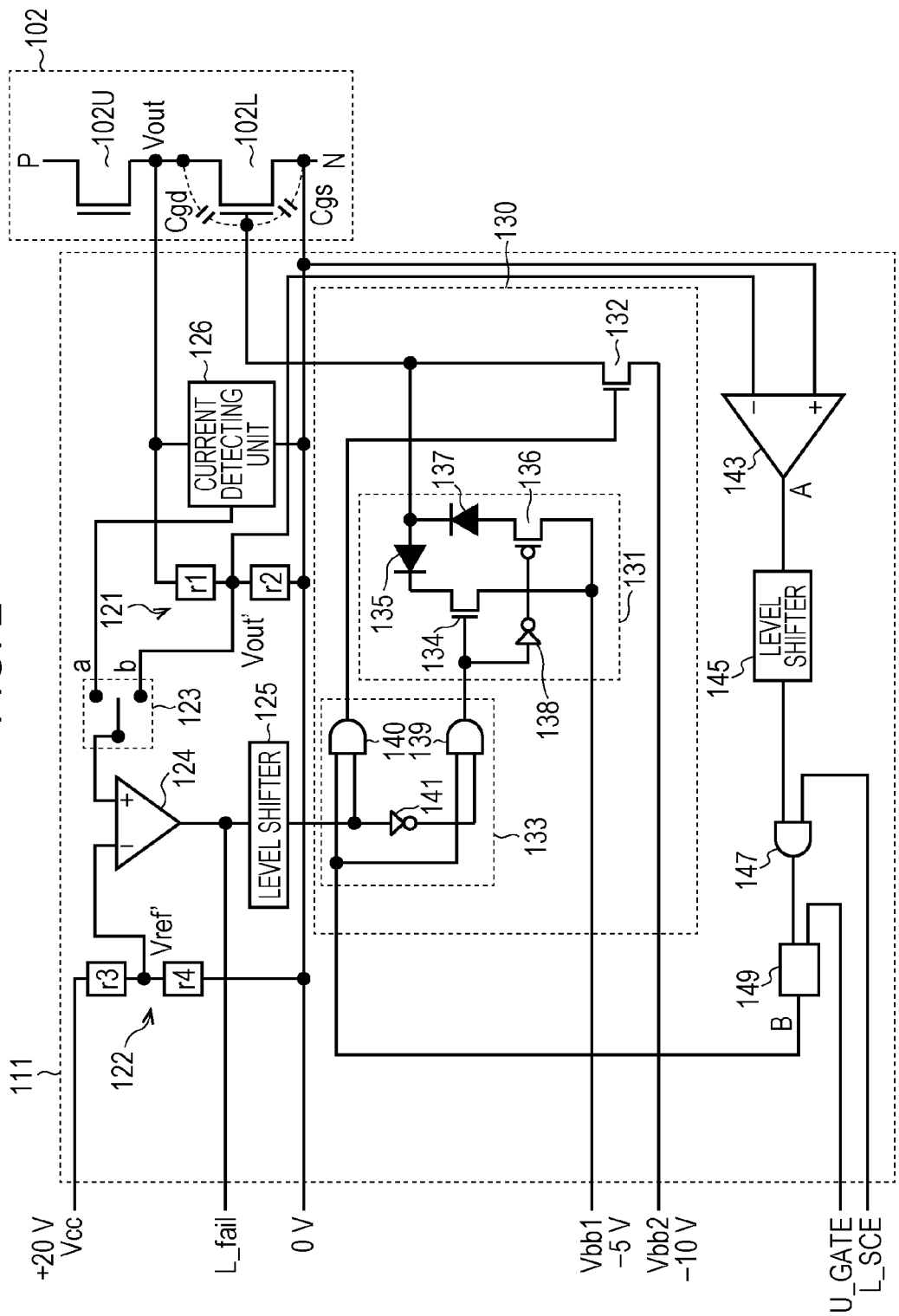
FIG. 2 is a circuit diagram illustrating a configuration of a source clamp unit of a lower arm driver according to the first embodiment.

FIG. 2 illustrates a configuration of a source clamp unit of a lower arm driver. The source clamp unit 111 is made up of voltage dividing circuits 121 and 122, a switch 123, a comparator 124, a level shift circuit 125, a current detecting unit 126, a gate voltage switching circuit 130, a comparator 143, a level shift circuit 145, an AND gate 147, and a latch circuit 149.

The voltage dividing circuit 121 divides the drain-source voltage Vout of the FET 102L to generate a voltage Vout' reflecting the drain-source voltage.

The voltage dividing circuit 122 divides the positive voltage (+20 V) to generate a voltage Vref'. The voltage Vref' may be converted into a reference voltage Vref between the drain and the source of the FET 102L by using the voltage division ratio of the voltage dividing circuit 121 and the voltage division ratio of the voltage dividing circuit 122. The reference voltage Vref is higher than the normal voltage VPN between the drain and the source of the FET 102L, but lower than the voltage at which the FET 102L misfires due to noise occurring between the drain and the source of the FET 102L. In the present embodiment, the voltage VPN is the power supply voltage applied to the ends of the bridge circuit 102.

The switch 123 is connected to an a-side when the FET 102L is on, and connected to a b-side when the FET 102L is off.

When the FET 102L is off, due to the action of the switch 123, the comparator 124 compares the output voltage Vout' of the voltage dividing circuit 121 to the output voltage Vref' of the voltage dividing circuit 122. In other words, the drain-source voltage Vout of the FET 102L and the reference voltage Vref are compared. The comparator 124 outputs high level when the drain-source voltage Vout of the FET 102L is equal to or greater than the reference voltage Vref, and outputs low level when the applied voltage Vout is less than the reference voltage Vref. The output of the comparator 124 is transmitted to the gate voltage switching circuit 130 via the level shift circuit 125. On the other hand, when the FET 102L is on, due to the action of the switch 123, the comparator 124 compares the output voltage of the current detecting unit 126 to the reference voltage Vref' of the voltage dividing circuit 122. The output voltage of the current detecting unit 126 reflects the drain current of the FET 102L. The comparator 124 outputs high level when the drain current is an overcurrent, and outputs low level when the drain current is not an overcurrent. The output of the comparator 124 is transmitted to the interface unit 109 as the overcurrent detection signal L_fail.

When the FET 102L is off, the gate voltage switching circuit 130 applies the first voltage (−5 V) between the gate and the source of the FET 102L if the drain-source voltage Vout is less than the reference voltage Vref, and applies the second voltage (−10 V) between the gate and the source if the applied voltage Vout is equal to or greater than the reference voltage Vref. Specifically, the gate voltage switching circuit 130 is made up of a first switch 131, a second switch 132, and a switch control circuit 133. The first switch 131 is inserted on the line that connects the gate of the FET 102L to the first voltage (−5 V) power supply Vbb1. Specifically, the first switch 131 is made up of an NMOS transistor 134, a diode 135, a PMOS transistor 136, a diode 137, and an inverter 138. The second switch 132 is inserted on the line that connects the gate of the FET 102L to the second voltage (−10 V) power supply Vbb2. Specifically, the second switch 132 is made up of an NMOS transistor. The switch control circuit 133 is made up of AND gates 139 and 140, and an inverter 141.

The positive and negative input terminals of the comparator 143 are connected to the source of the FET 102L and the output of the voltage dividing circuit 121, respectively. The output voltage Vout' of the voltage dividing circuit 121 reflects the drain-source voltage Vout of the FET 102L. Consequently, when the voltage Vout is positive, the output A of the comparator 143 goes to low level, and when Vout is negative, the output A of the comparator 143 goes to high level. After the FET 102L transitions from on to off, if a flyback current is flowing through the flyback diode on the lower arm side, the voltage Vout is negative, and thus the output A of the comparator 143 goes to high level. The output A of the comparator 143 is transmitted to the AND gate 147 via the level shift circuit 145. When the FET 102L is off, the source clamp enable signal L_SCE on the lower arm side is at high level, and thus if the output A of the comparator 143 goes to high level, the output of the AND gate 147 goes to high level. The output of the AND gate 147 is transmitted to the latch circuit 149. The gate driving signal U_GATE on the upper arm side transitions from low level to high level after a predetermined period after the gate driving signal L_GATE on the lower arm side transitions from high level to low level. The output of the AND gate 147 at the time of the rising edge of the gate driving signal U_GATE on the upper arm side is held in the latch circuit 149, and the output B of the latch circuit 149 goes to high level. At this point, the outputs of the AND gates 139 and 140 depend on the output of the comparator 124. Also, the outputs of the AND gates 139 and 140 are complementary, in that if one is at high level, the other is at low level. If the normal voltage VPN is being applied between the drain and the source of the FET 102L, the output of the comparator 124 goes to low level, and as a result, the first switch 131 turns on while the second switch 132 turns off. At this point, the gate-source voltage V_gate of the FET 102L becomes the first voltage (−5 V). On the other hand, if the drain-source voltage Vout becomes equal to or greater than the reference voltage Vref due to noise occurring between the drain and the source of the FET 102L, the output of the comparator 124 goes to high level, and as a result, the first switch 131 turns off while the second switch 132 turns on. At this point, the gate-source voltage V_gate of the FET 102L becomes the second voltage (−10 V).

(Operation)

Figure 3:
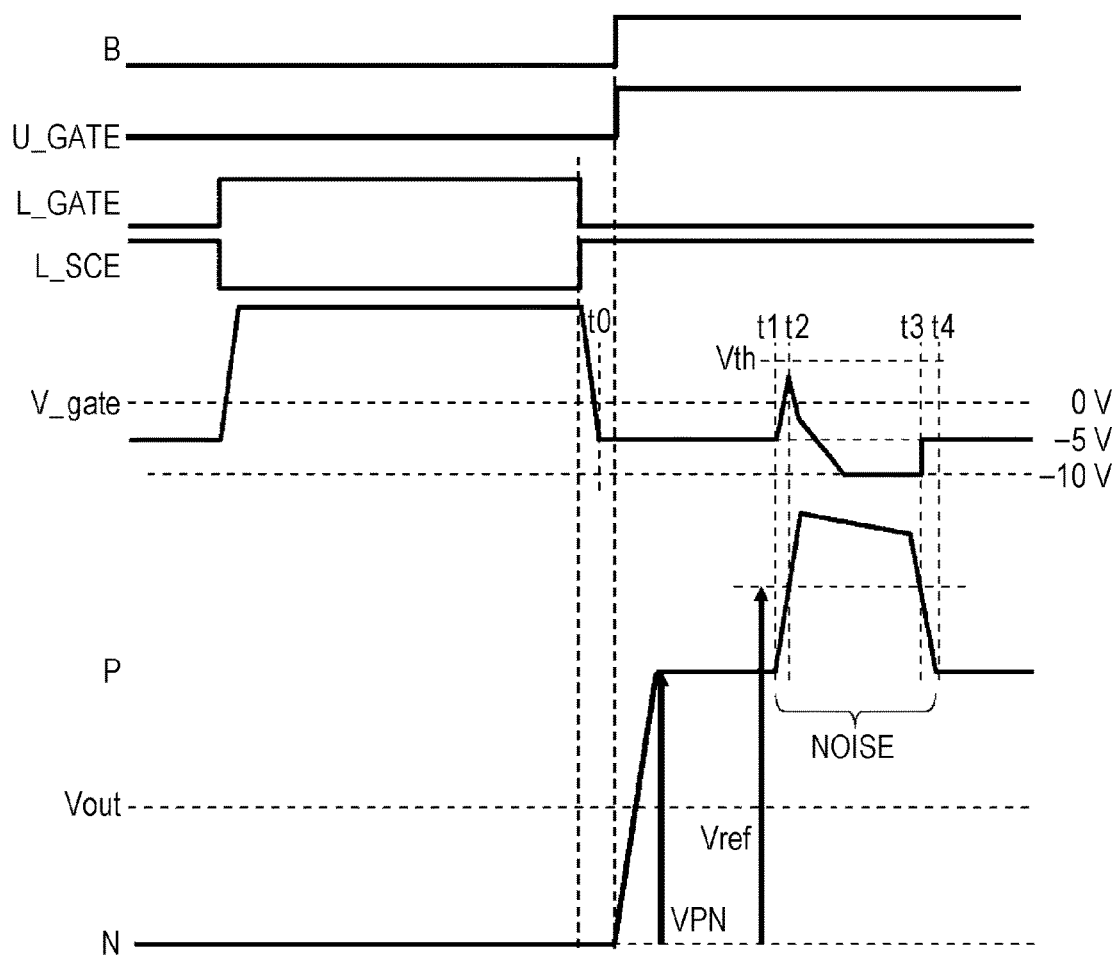
FIG. 3 is a timing chart illustrating operation of the source clamp unit of a lower arm driver according to the first embodiment.

FIG. 3 illustrates operation of a source clamp unit of a lower arm driver.

Misfiring of the FET 102L is induced when noise that expands the drain-source voltage occurs. Hereinafter, an example of noise expanding the drain-source voltage by raising the output voltage Vout will be described.

First, during a period from time t0 to time t1, the drain-source voltage Vout of the FET 102L is normally the voltage VPN. At this point, since the output of the comparator 124 is low level, the first switch 131 turns on while the second switch 132 turns off. As result, the gate-source voltage V_gate of the FET 102L becomes the first voltage (−5 V).

After time t1 elapses, noise that expands the drain-source voltage of the FET 102L occurs. The gate-drain parasitic capacitance Cgd and the gate-source parasitic capacitance Cgs of the FET 102L are considered to be connected in series (see FIG. 2). For this reason, if noise that expands the drain-source voltage of the FET 102L occurs, the voltage at both ends of the parasitic capacitance Cgs tries to expand by an amount depending on the voltage division ratio of the parasitic capacitances Cgd and Cgs. This works to raise the gate-source voltage V_gate of the FET 102L. However, the gate voltage switching circuit 130 tries to keep the gate-source voltage of the FET 102L at the first voltage (−5 V). The gate-source voltage V_gate of the FET 102L rises according to the combination of these factors.

At time t2, the drain-source voltage Vout of the FET 102L becomes equal to or greater than the reference voltage Vref. At this point, the output of the comparator 124 inverts from low level to high level, and the first switch 131 turns off while the second switch 132 turns on. As a result, the gate-source voltage V_gate of the FET 102L switches from the first voltage (−5 V) to the second voltage (−10 V). For this reason, the gate-source voltage V_gate may be moderated and kept from becoming equal to or greater than the gate threshold voltage Vth. In other words, misfiring of the FET 102L may be suppressed.

Note that during the period when the FET 102L transitions from on to off, the source clamp enable signal L_SCE on the lower arm side is high level, and in addition, the output B of the latch circuit 149 goes to high level at the point when the gate driving signal U_GATE on the upper arm side goes to high level after the gate-source voltage Vout of the FET 102L becomes negative. The gate driving signal U_GATE on the upper arm side goes to high level after the FET 102L finishes transitioning from on to off. Consequently, the source clamp unit of the lower arm driver according to the present disclosure does not conduct the operation to switch the gate-source voltage V_gate of the FET 102L from the first voltage (−5 V) to the second voltage (−10 V) while the FET 102L is in the process of transitioning from on to off.

At time t3, the drain-source voltage Vout of the FET 102L becomes less than the reference voltage Vref. At this point, the output of the comparator 124 inverts from high level to low level, and the first switch 131 turns on while the second switch 132 turns off. As a result, the gate-source voltage V_gate of the FET 101L switches from the second voltage (−10 V) to the first voltage (−5 V). For this reason, lowered conduction performance of the channel diode may be moderated.

Figure 4:
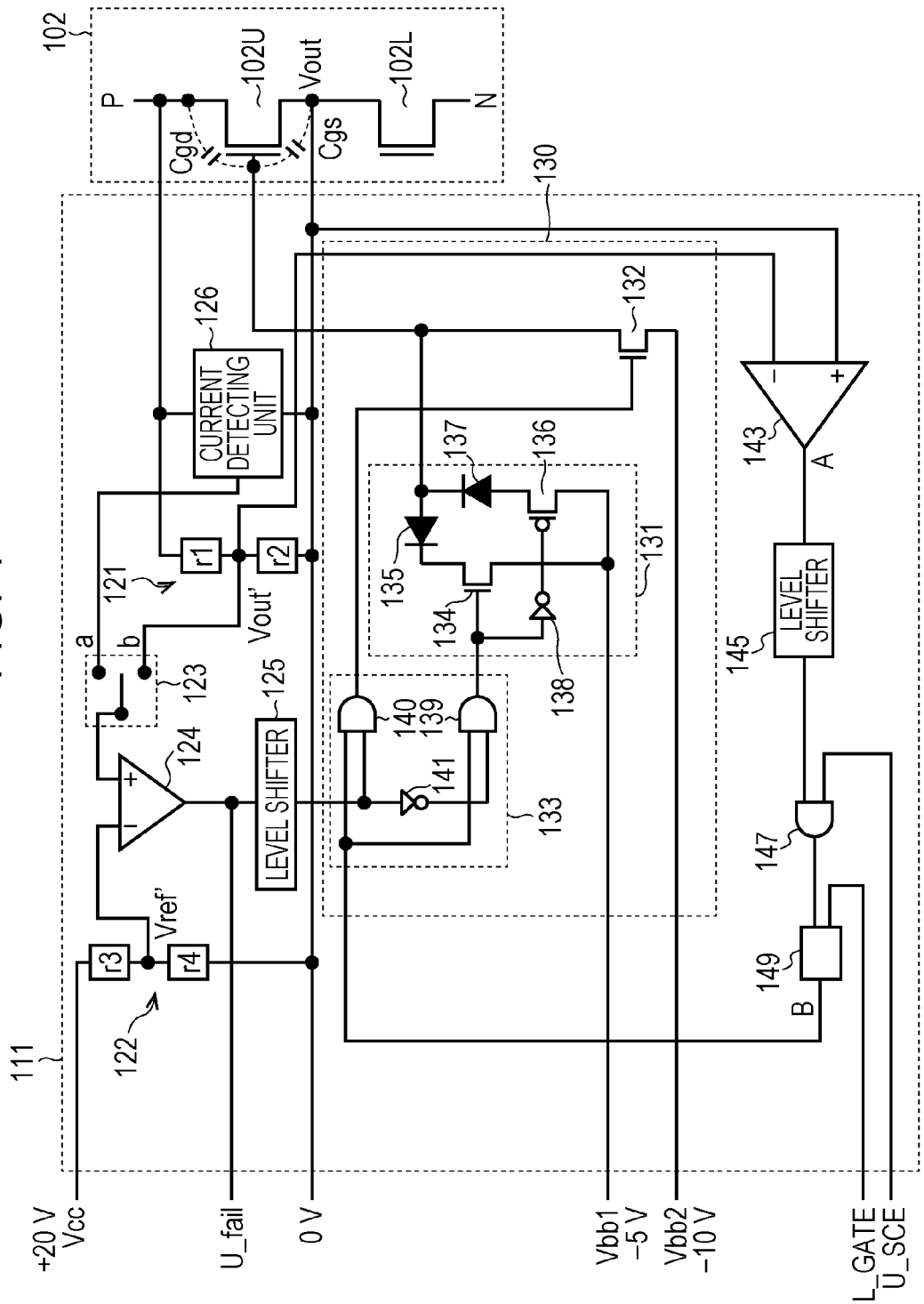
FIG. 4 is a circuit diagram illustrating a configuration of a source clamp unit of an upper arm driver according to the first embodiment.
Figure 5:
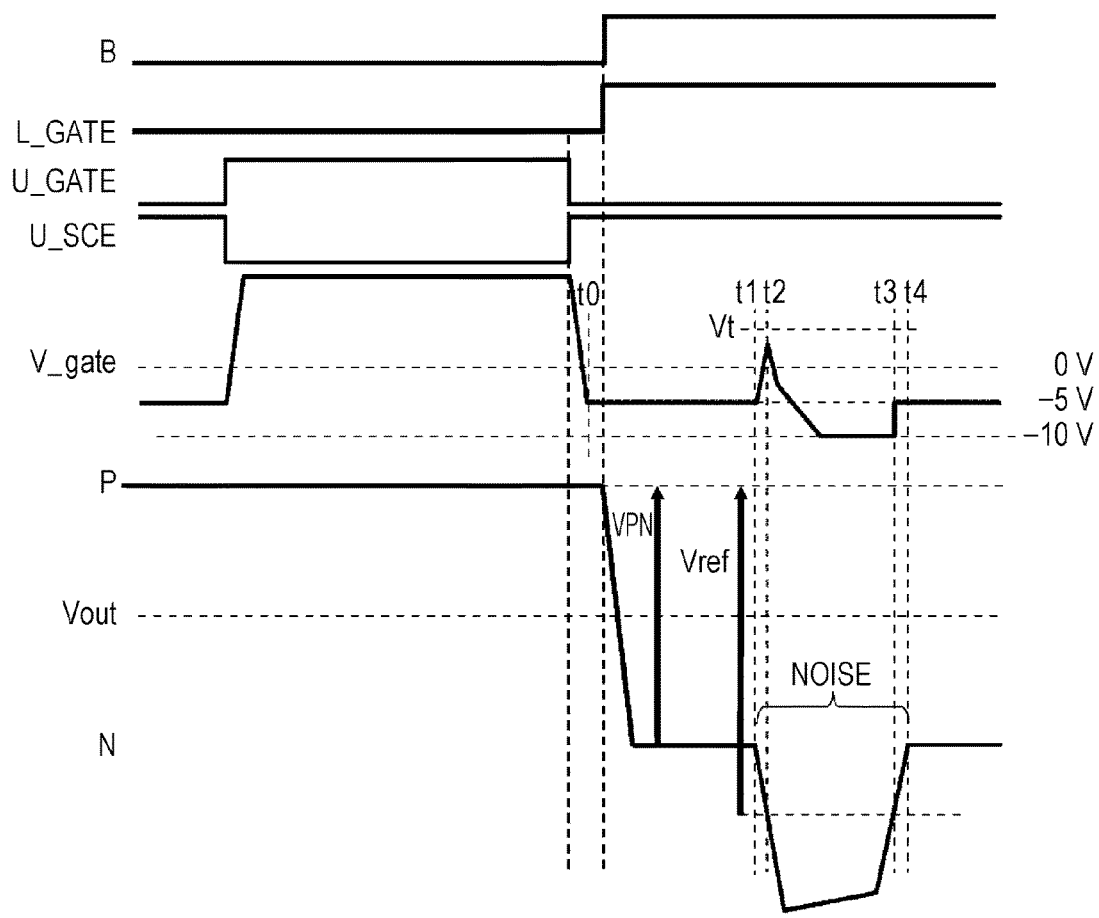
FIG. 5 is a timing chart illustrating operation of the source clamp unit of an upper arm driver according to the first embodiment.

FIG. 4 illustrates a configuration of a source clamp unit of an upper arm driver. The source clamp unit of the upper arm driver has the same configuration as the source clamp unit of the lower arm driver. Also, FIG. 5 illustrates operation of the source clamp unit of the upper arm driver. Misfiring of the FET 102U is induced when noise that expands the drain-source voltage occurs. Herein, an example of noise expanding the drain-source voltage by lowering the output voltage Vout is given. Even with the upper arm driver, advantageous effects similar to the lower arm driver may be obtained.

(Conclusion)

As described above, the gate driver 101 judges an increased likelihood of FET misfiring by detecting that the drain-source voltage of the FET has become equal to or greater than the reference voltage. If the likelihood of misfiring increases, the gate driver 101 switches the voltage applied between the gate and the source of the FET from the first voltage to the second voltage. Herein, provided that V1 is the first voltage and V2 is the second voltage, Vth>V1>V2 is satisfied, and in addition, the second voltage V2 is a negative voltage. As a result, the gate voltage V_gate of the FET may be moderated and kept from becoming equal to or greater than the gate threshold voltage Vth.

In addition, the gate driver 101 judges a decreased likelihood of FET misfiring by detecting that the drain-source voltage of the FET has become less than the reference voltage. If the likelihood of misfiring decreases, the gate driver 101 switches the voltage applied between the gate and the source of the FET from the second voltage to the first voltage. As a result, lowered conduction performance of the channel diode of the FET may be moderated.

In this way, by having the gate driver 101 suitably select between the first voltage and the second voltage as the voltage applied between the gate and the source when the FET is off, it becomes possible to moderate lowered conduction performance of the channel diode of the FET, and in addition, suppress misfiring of the FET.

In addition, in the case of using the channel diode of the FET as a flyback diode, a current does not necessarily flow through the channel diode continuously while the FET is off. Under conditions in which a current does not flow through the channel diode, even if the second voltage is applied between the gate and the source of the FET, the problem of lowered conduction performance does not even occur in the first place. For this reason, according to the gate driver 101, when there is no overlap between the period when a current flows through the channel diode of the FET and the period of a higher likelihood of misfiring, the problem of lowered conduction performance may be prevented from occurring in the first place. Also, according to the gate driver 101, even when there is overlap between the period when a current flows through the channel diode of the FET and the period of a higher likelihood of misfiring, the problem of lowered conduction performance may be minimized.

In addition, when the FET is on, the gate driver 101 does not even need to detect the likelihood of misfiring in the first place. For this reason, in the present embodiment, when the FET is on, the comparator 124 built into the source clamp unit 111 is utilized to detect overcurrent in the drain current. In this way, by sharing the circuit inside the source clamp unit 111 for two applications, a decreased number of parts and lower costs become possible.

Second Embodiment

In the second embodiment, the configuration of the source clamp unit differs from the first embodiment. As a result, the quantity of DC-DC converters in the internal power supply is decreased. Hereinafter, structural elements that are the same as the first embodiment are denoted with the same signs, and description thereof will be reduced or omitted.

(Configuration)

Figure 6:
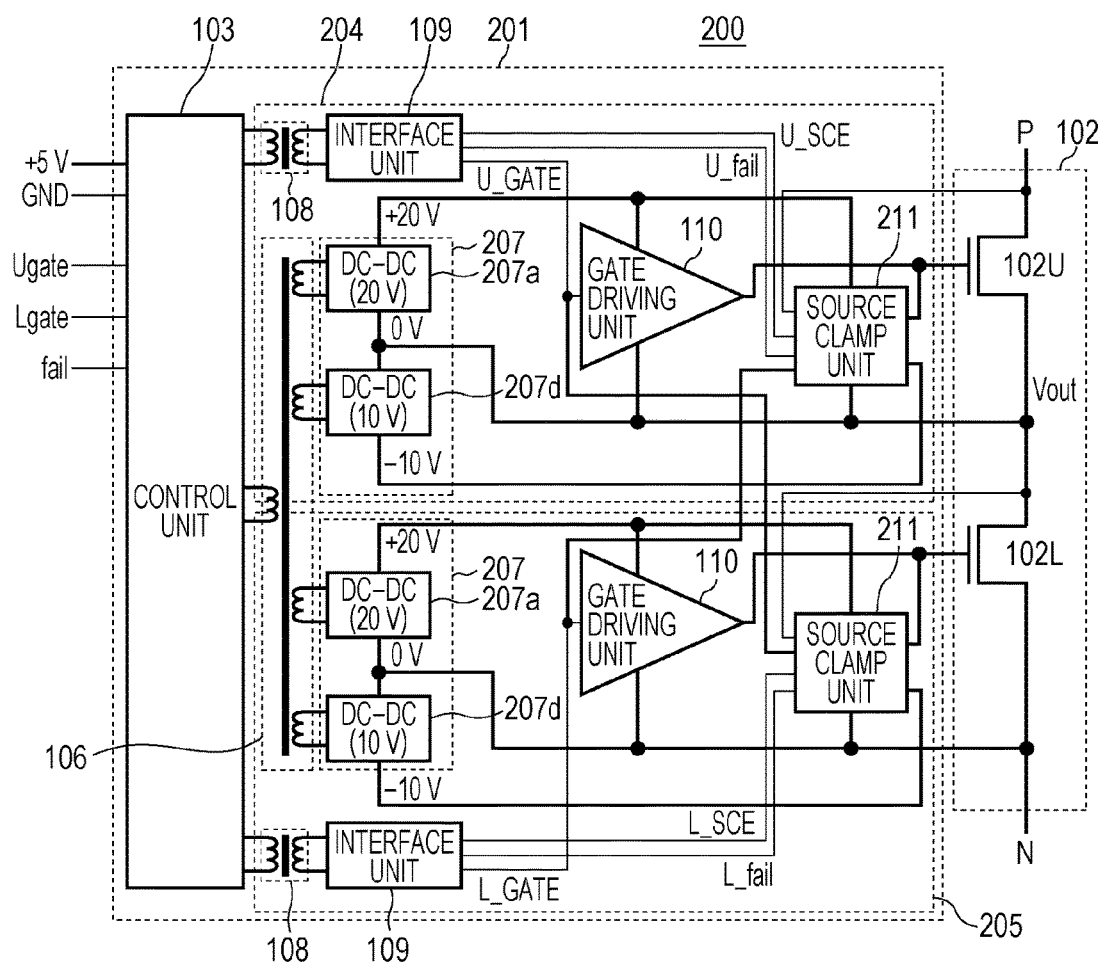
FIG. 6 is a circuit diagram illustrating an overall configuration of a power module according to the second embodiment.

FIG. 6 is a diagram illustrating an overall configuration of a power module according to the second embodiment.

The power module 200 is made up of a gate driver 201 and a bridge circuit 102.

The gate driver 201 is made up of a control unit 103, an upper arm driver 204, and a lower arm driver 205. The upper arm driver 204 is made up of a power supply transformer 106, an internal power supply 207, an isolation transformer 108, an interface unit 109, a gate driving unit 110, and a source clamp unit 211. The lower arm driver 205 has the same configuration as the upper arm driver 204.

Each internal power supply 207 is made up of DC-DC converters 207a and 207d. The DC-DC converters 207a and 207d respectively generate a +20 V and a +10 V DC voltage from a pulse input by the power supply transformer 106. The DC-DC converter 207a functions as a positive voltage power supply (+20 V). The DC-DC converter 207d functions as a second power supply (−10 V).

Figure 7:
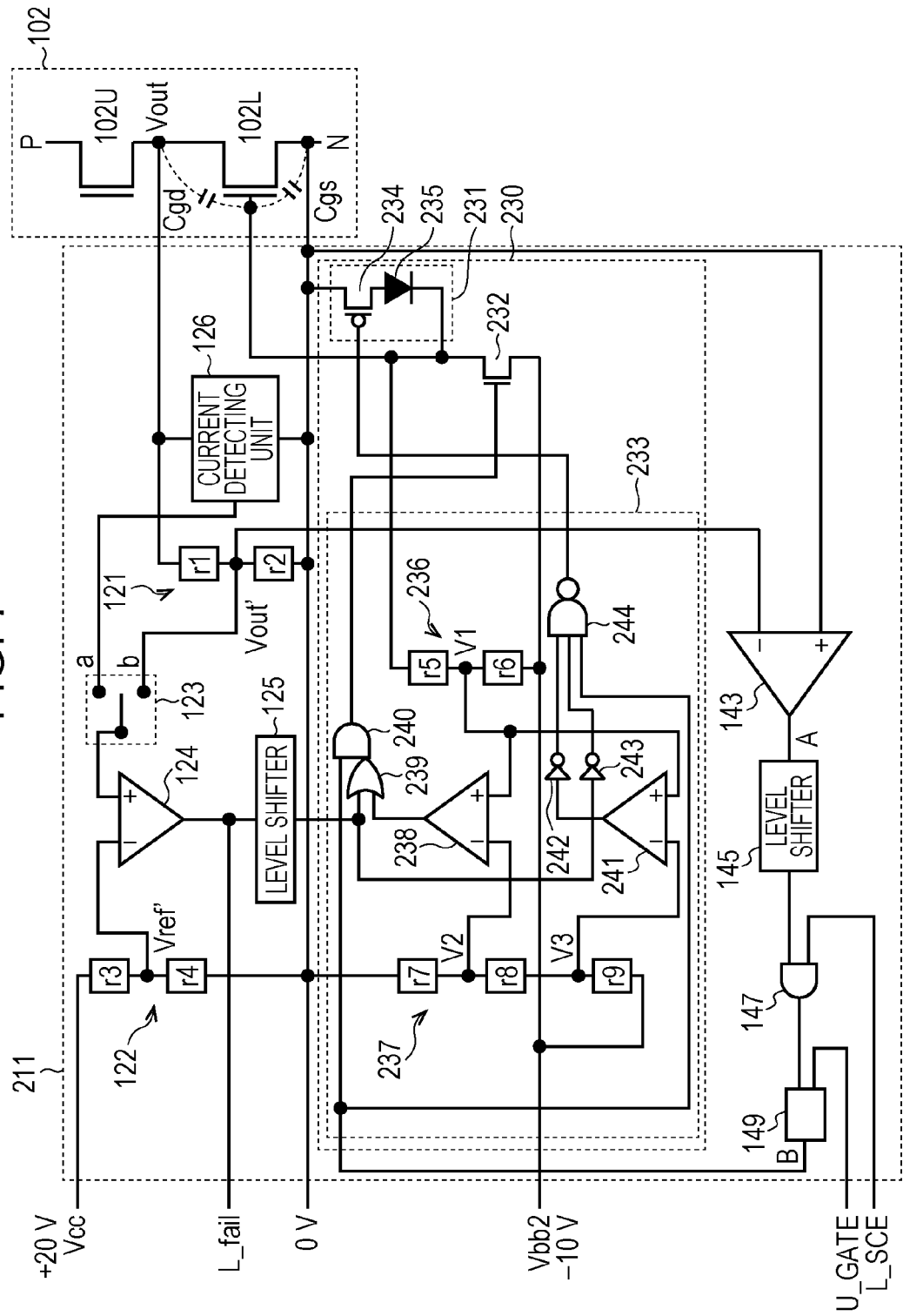
FIG. 7 is a circuit diagram illustrating a configuration of a source clamp unit of a lower arm driver according to the second embodiment.

FIG. 7 illustrates a configuration of a source clamp unit of a lower arm driver. The source clamp unit 211 is made up of voltage dividing circuits 121 and 122, a switch 123, a comparator 124, a level shift circuit 125, a current detecting unit 126, a gate voltage switching circuit 230, a comparator 143, a level shift circuit 145, an AND gate 147, and a latch circuit 149.

The gate voltage switching circuit 230 is made up of a first switch 231, a second switch 232, and a switch control circuit 233. The first switch 231 is inserted on the line that joins the gate and the source of the FET 102L. Specifically, the first switch 231 is made up of a PMOS transistor 234 and a diode 235. The second switch 232 is inserted on the line that connects the gate of the FET 102L to the second voltage (−10 V) power supply Vbb2. Specifically, the second switch 232 is made up of an NMOS transistor. The switch control circuit 233 is made up of voltage dividing circuits 236 and 237, a comparator 238, an OR gate 239, an AND gate 240, a comparator 241, inverters 242 and 243, and a NAND gate 244. The voltage dividing circuit 236 outputs a voltage V1 reflecting the gate-source voltage of the FET 102L. The voltage dividing circuit 237 outputs a voltage V2 reflecting the first voltage (−5 V) and a voltage V3 reflecting a third voltage (−5.5 V).

The gate voltage switching circuit 230 exists in at least the following three states when the FET 102L is off and the output B of the latch circuit 149 is high level.

(a) Case in which Noise does not Occur, and −5 V V_Gate

If the normal voltage VPN is being applied between the drain and the source of the FET 102L, the output of the comparator 124 goes to low level. Also, when the gate-source voltage V_gate of the FET 102L is a more positive voltage than the first voltage (−5 V), the output of the comparator 238 goes to high level. At this point, since the output of the AND gate 240 goes to high level, the second switch 232 turns on.

Also, the output of the comparator 241 goes to high level, and the output of the inverter 242 goes to low level. At this point, since the output of the NAND gate 244 goes to high level, the first switch 231 turns off.

Figure 8:
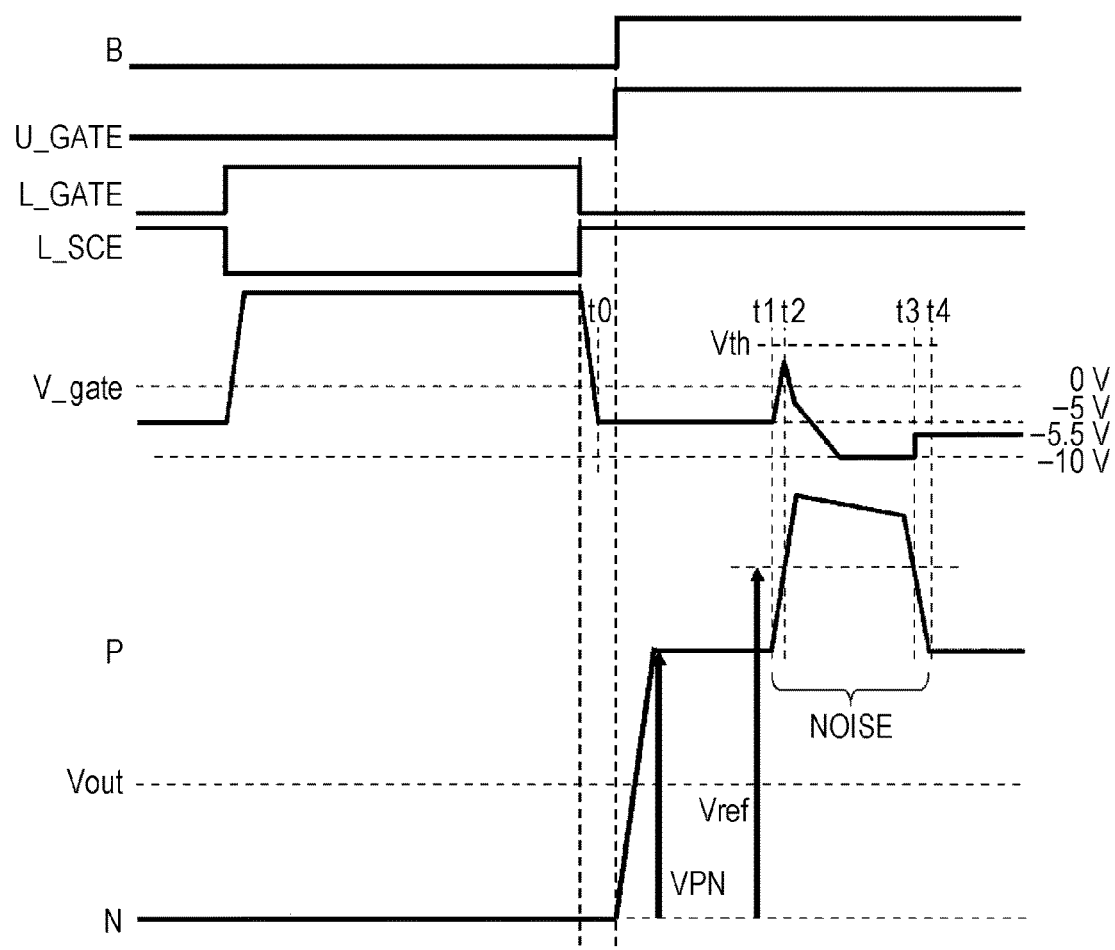
FIG. 8 is a timing chart illustrating operation of the source clamp unit of a lower arm driver according to the second embodiment.

In this way, since the first switch 231 turns off while the second switch 232 turns on, the gate-source voltage V_gate of the FET 102L gradually falls. Subsequently, after reaching the first voltage (−5 V), the output of the comparator 238 inverts from high level to low level, and thus the second switch 232 turns off. Consequently, the voltage between the gate and the source of the FET 102L is set to the first voltage (−5 V) (the period from time t0 to t1 in FIG. 8).

(b) Case in which Noise Occurs

If the drain-source voltage Vout becomes equal to or greater than the reference voltage Vref due to noise occurring between the drain and the source of the FET 102L, the output of the comparator 124 goes to high level. At this point, since the output of the AND gate 240 goes to high level, the second switch 232 turns on.

Also, since the output of the comparator 124 goes to high level, the output of the inverter 243 goes to low level. At this point, since the output of the NAND gate 244 goes to high level, the first switch 231 turns off.

After the output of the comparator 124 goes to high level, the second switch 232 forcibly turns on, irrespective of the output of the comparator 238. For this reason, the gate-source voltage V_gate of the FET 102L is set to the second voltage (−10 V) (the period from time t2 to t3 in FIG. 8).

(c) Case in which Noise does not Occur, and −10 V V_Gate≤−5.5 V

If the normal voltage VPN is being applied between the drain and the source of the FET 102L, the output of the comparator 124 goes to low level. Also, when the gate-source voltage V_gate of the FET 102L is included in the range from the second voltage (−10 V) to the third voltage (−5.5 V), the output of the comparator 238 goes to low level. At this point, since the output of the AND gate 240 goes to low level, the second switch 232 turns off.

Meanwhile, the output of the comparator 241 goes to low level, and the output of the inverter 242 goes to high level. Also, since the output of the comparator 124 goes to low level, the output of the inverter 243 goes to high level. Furthermore, the output B of the latch circuit 149 is high level. Consequently, since the output of the NAND gate 244 goes to low level, the first switch 231 turns on.

In this way, since the first switch 231 turns on while the second switch 232 turns off, the gate-source voltage V_gate of the FET 102L gradually rises. Subsequently, after reaching the third voltage (−5.5 V), the output of the comparator 241 inverts from low level to high level, and thus the first switch 231 turns off. Consequently, the voltage between the gate and the source of the FET 102L is set to the third voltage (−5.5 V) (the period from time t3 in FIG. 8).

(Conclusion)

As described above, in the second embodiment, the switch control circuit 233 is equipped with a voltage regulator function. As a result, the quantity of DC-DC converters in the internal power supply 207 is decreased to two. Note that similar advantageous effects may also be obtained for the upper arm driver.

Third Embodiment

In the third embodiment, the method of detecting a lower likelihood of misfiring differs from the first embodiment.

Namely, in the first embodiment, the likelihood of misfiring is considered to be lower as a result of the drain-source voltage becomes less than a reference voltage. In contrast, in the third embodiment, the likelihood of misfiring is considered to be lower as a result a fixed period elapsing since a time when the drain-source voltage became equal to or greater than the reference voltage. Hereinafter, structural elements that are the same as the first embodiment are denoted with the same signs, and description thereof will be reduced or omitted.

(Configuration)

Figure 9:
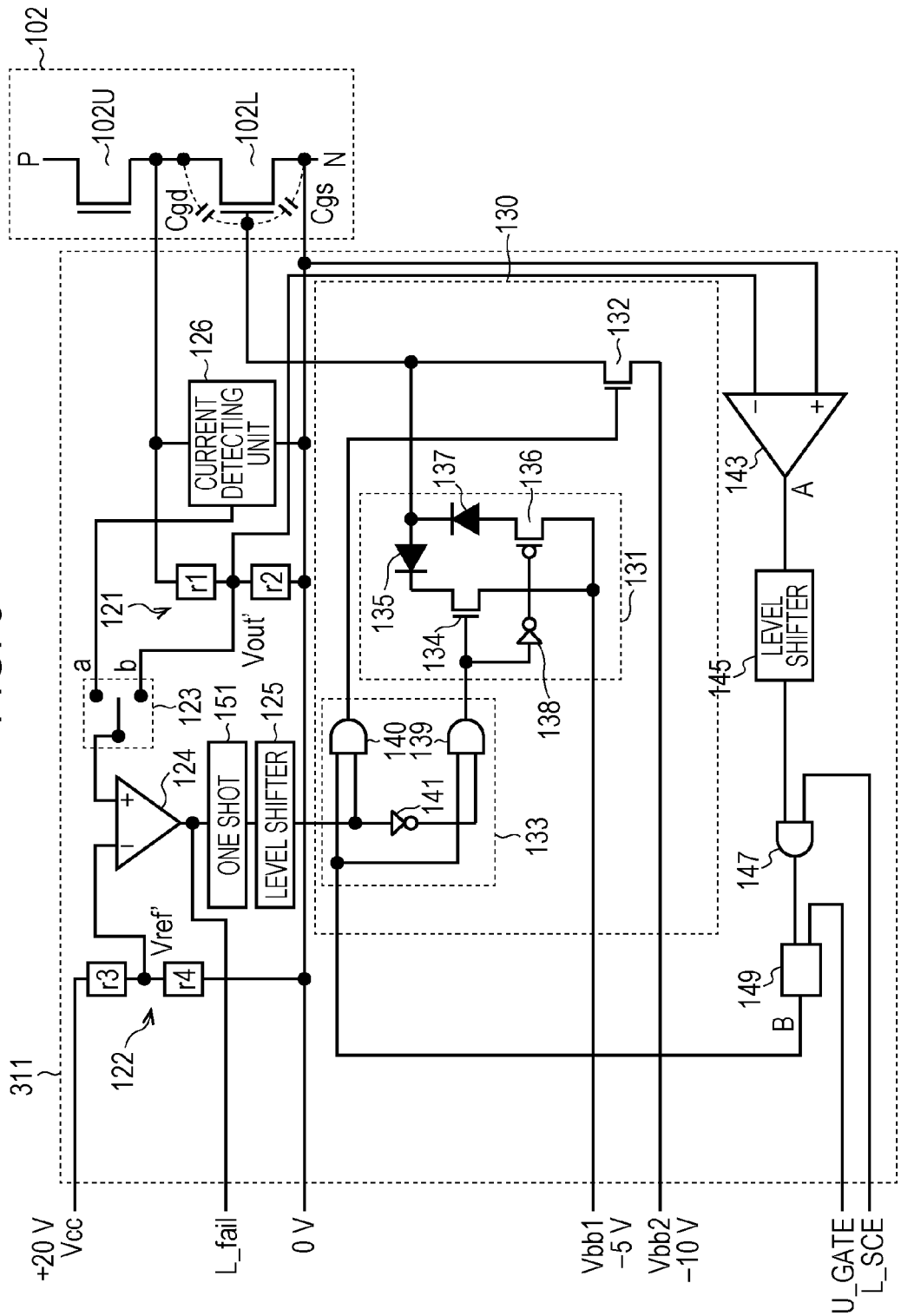
FIG. 9 is a circuit diagram illustrating a configuration of a source clamp unit of a lower arm driver according to the third embodiment.

FIG. 9 illustrates a configuration of a source clamp unit of a lower arm driver. The source clamp unit 311 is made up of voltage dividing circuits 121 and 122, a switch 123, a comparator 124, a level shift circuit 125, a current detecting unit 126, a one shot circuit 151, a gate voltage switching circuit 130, a comparator 143, a level shift circuit 145, an AND gate 147, and a latch circuit 149.

Figure 10:
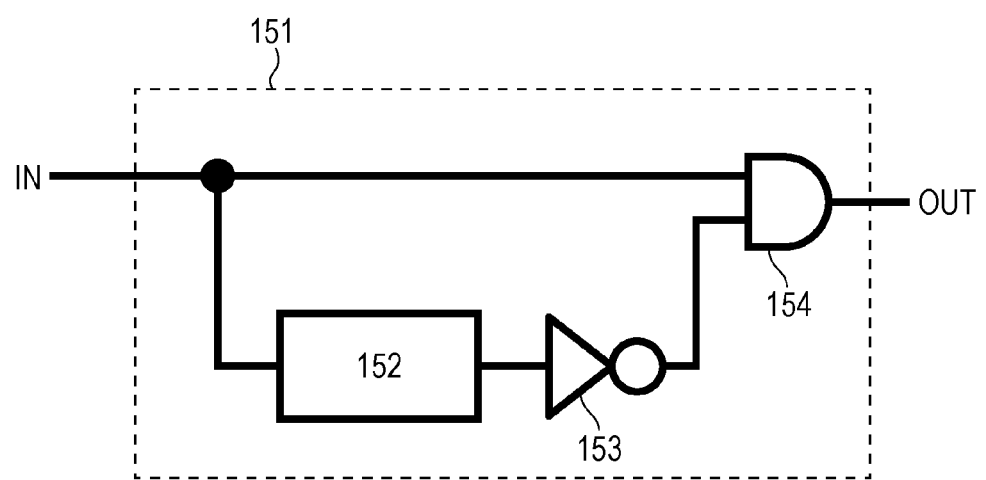
FIG. 10 is a circuit diagram illustrating an example of a configuration of a one shot circuit.
Figure 11:
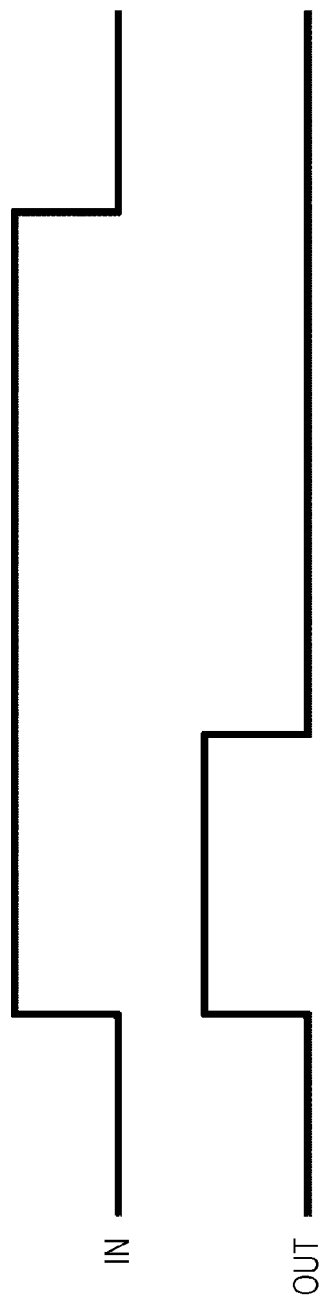
FIG. 11 is a timing chart illustrating operation of the one shot circuit in FIG. 10.

The one shot circuit 151 is inserted on the pathway that transmits the output of the comparator 124 to the gate voltage switching circuit 130. FIG. 10 illustrates an example of the configuration of the one shot circuit, and FIG. 11 illustrates operation of the one shot circuit. The one shot circuit 151 is made up of a delay circuit 152, an inverter 153, and an AND gate 154. According to this configuration, the output OUT inverts from low level to high level when the input IN inverts from low level to high level. After that, the output OUT inverts from high level to low level after the elapsing of a fixed period determined by the characteristics of the delay circuit 152. Consequently, the one shot circuit 151 functions as a period detecting unit that detects the elapsing of a fixed period that starts when noise occurs between the drain and the source of the FET 102L. The length of the fixed period is set to the length of the period from the time when the likelihood of misfiring rises due to noise occurring between the drain and the source of the FET 102L, to the time when the likelihood of misfiring falls due to the drain-source voltage stabilizing. A suitable length for this period may be computed by simulation or the like.

Figure 12:
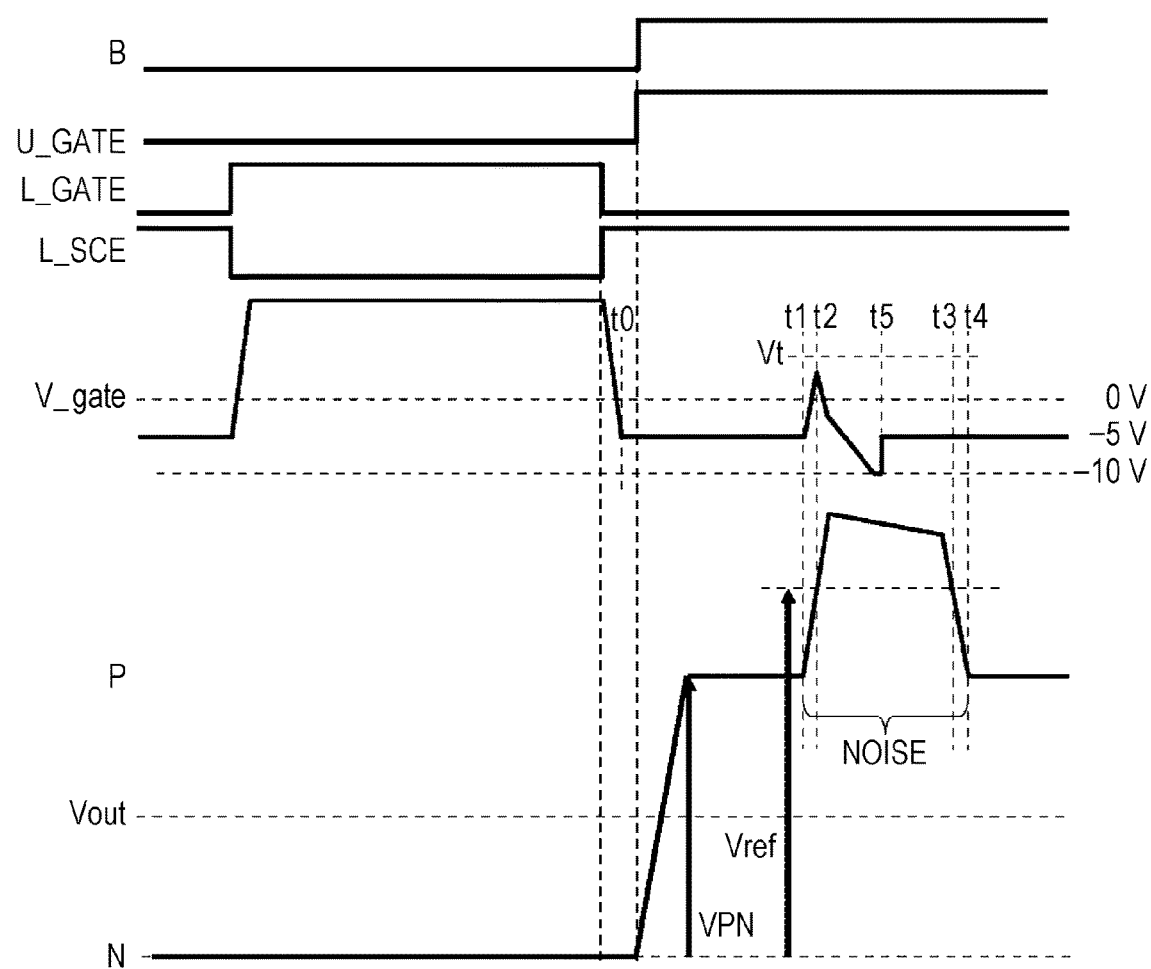
FIG. 12 is a timing chart illustrating operation of the source clamp unit of a lower arm driver according to the third embodiment.

FIG. 12 illustrates operation of a source clamp unit of a lower arm driver.

During a period from time t0 to time t1, the drain-source voltage Vout of the FET 102L is the voltage VPN. At this point, the gate-source voltage V_gate of the FET 102L becomes the first voltage (−5 V).

After time t1 elapses, noise occurs, and at time t2, the drain-source voltage Vout of the FET 102L becomes equal to or greater than the reference voltage Vref. At this point, the output of the comparator 124 inverts from low level to high level, and the output of the one shot circuit 151 inverts from low level to high level. As a result, the gate-source voltage V_gate of the FET 102L switches from the first voltage (−5 V) to the second voltage (−10 V).

After that, at time t5, the output of the one shot circuit 151 inverts from high level to low level as a result of the fixed period elapsing. As a result, the gate-source voltage V_gate of the FET 101L switches from the second voltage (−10 V) to the first voltage (−5 V).

(Conclusion)

For example, in the case of table-shaped noise as illustrated in FIG. 12, the likelihood of FET misfiring may conceivably rise during the period in which the drain-source voltage expands, and after that, lower when the drain-source voltage stabilizes. If the drain-source voltage of the FET becomes equal to or greater than the reference voltage, the gate driver of the present embodiment switches the gate-source voltage from the first voltage (−5 V) to the second voltage (−10 V). As a result, the gate voltage V_gate may be moderated and kept from becoming equal to or greater than the gate threshold voltage Vth. Also, after the fixed period elapses, the gate driver subsequently switches the gate-source voltage from the second voltage (−10 V) to the first voltage (−5 V). Consequently, since the gate-source voltage of the FET is quickly reverted to the first voltage, it is possible to lengthen the period in which the channel diode exhibits good conduction performance.

Figure 13:
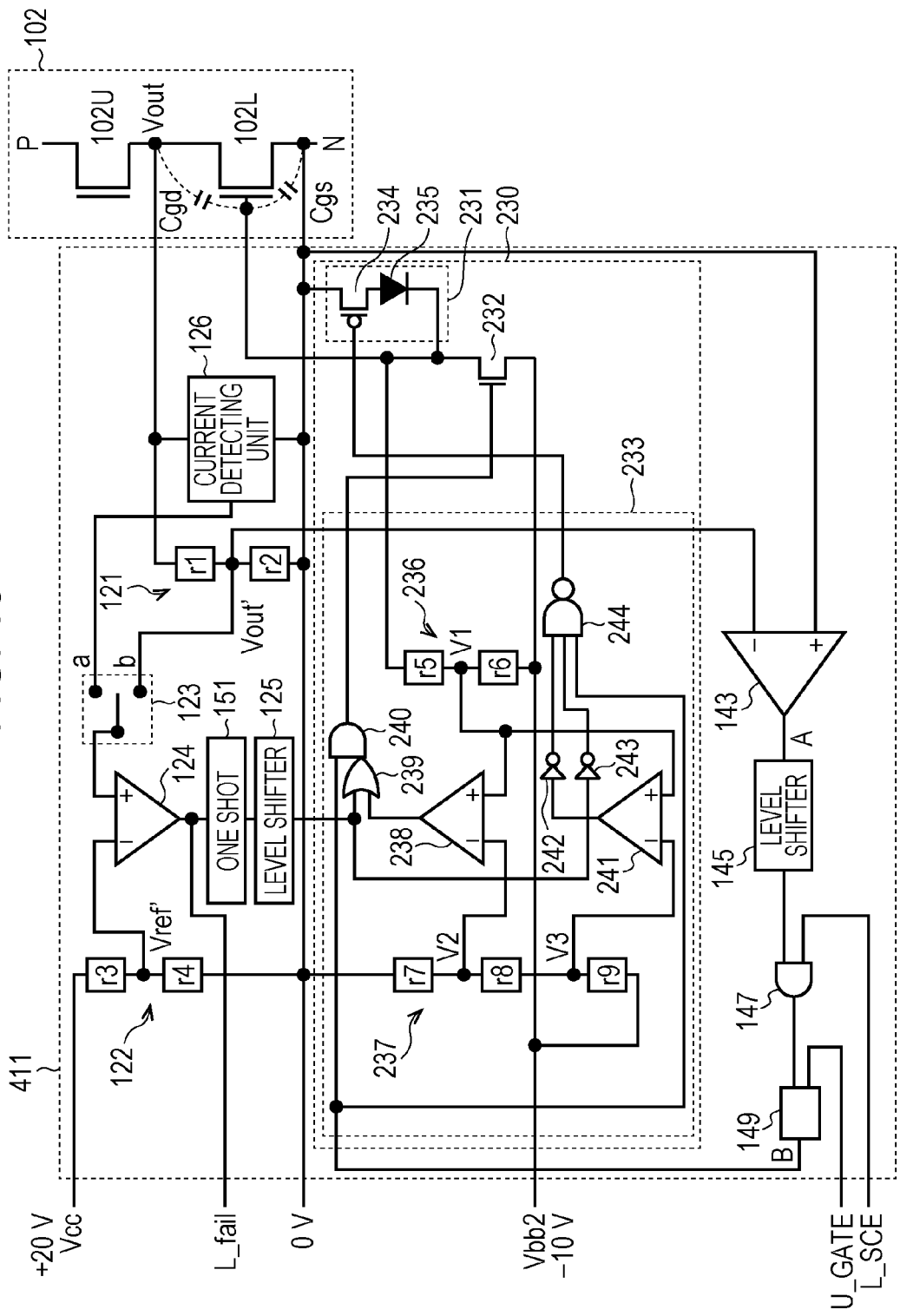
FIG. 13 is a circuit diagram illustrating a configuration of a source clamp unit of a lower arm driver according to a modification of the third embodiment.

The above describes the lower arm driver, but similar advantageous effects may also be obtained for the upper arm driver. In addition, similar advantageous effects may also be obtained with a configuration that adds the one shot circuit 151 to the source clamp unit 211 of the second embodiment, like the source-clamp unit 411 illustrated in FIG. 13.

Fourth Embodiment

The fourth embodiment includes a configuration that prevents misdetection of a high likelihood of misfiring even though the likelihood of misfiring is low. Hereinafter, structural elements that are the same as the first embodiment are denoted with the same signs, and description thereof will be reduced or omitted.

(Configuration)

Figure 14:
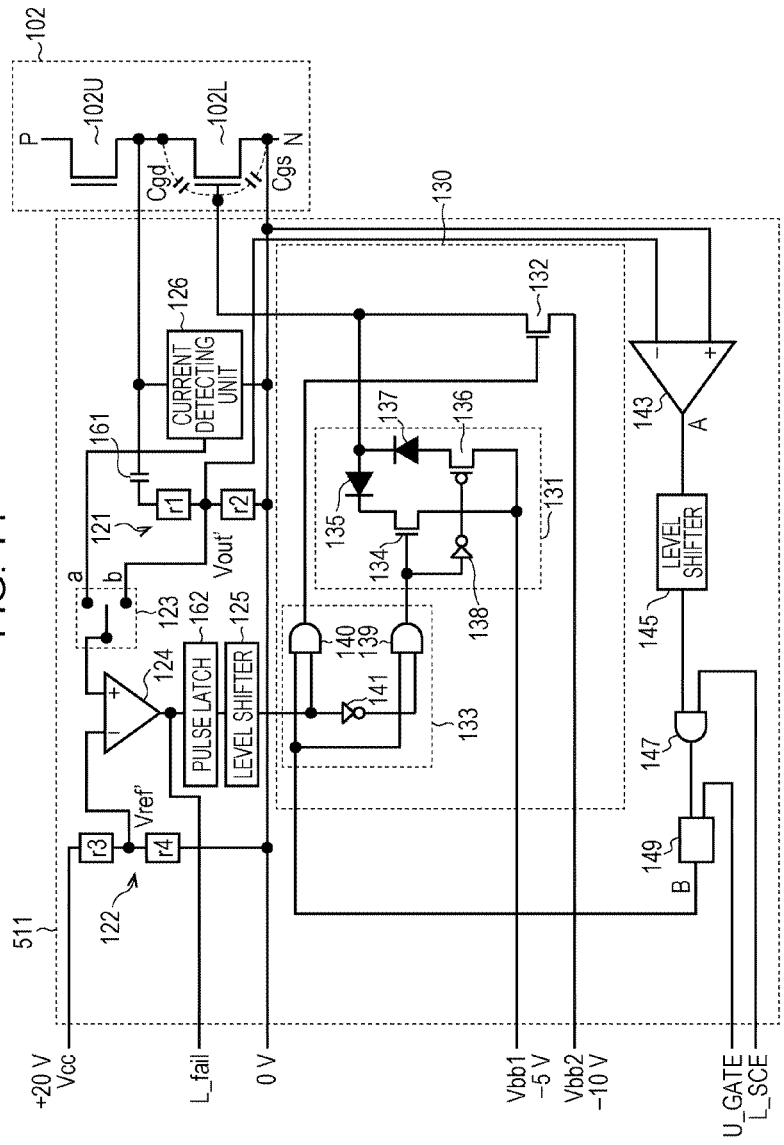
FIG. 14 is a circuit diagram illustrating a configuration of a source clamp unit of a lower arm driver according to the fourth embodiment.

FIG. 14 illustrates a configuration of a source clamp unit of a lower arm driver. The source clamp unit 511 is made up of voltage dividing circuits 121 and 122, a switch 123, a comparator 124, a level shift circuit 125, a current detecting unit 126, a capacitor 161, a pulse latch circuit 162, a gate voltage switching circuit 130, a comparator 143, a level shift circuit 145, an AND gate 147, and a latch circuit 149.

The capacitor 161 is inserted on the pathway that transmits the drain-source voltage of the FET 102L to the comparator 124, and functions as a high-pass filter. The filter characteristics are determined by the capacitance of the capacitor 161 and the resistance of the voltage dividing circuit 121. When the drain-source voltage of the FET 102L has a low time rate of change, there is little effect on the gate-source voltage via the parasitic capacitances Cgd and Cgs, and the likelihood of misfiring is considered to be low. Conversely, when the drain-source voltage of the FET 102L has a high time rate of change, there is a large effect on the gate-source voltage via the parasitic capacitances Cgd and Cgs, and the likelihood of misfiring is considered to be high. The capacitor 161 transmits the drain-source voltage to the comparator 124 only in the case in which the time rate of change of the drain-source voltage is equal to or greater than a predetermined value determined according to the filter characteristics. As a result, under conditions in which the time rate of change of the drain-source voltage is low, and as a result, the likelihood of misfiring is low, the drain-source voltage is prevented from being transmitted to the comparator 124. Consequently, it is possible to prevent misdetection of a high likelihood of misfiring even though the likelihood of misfiring is low.

Figure 15:
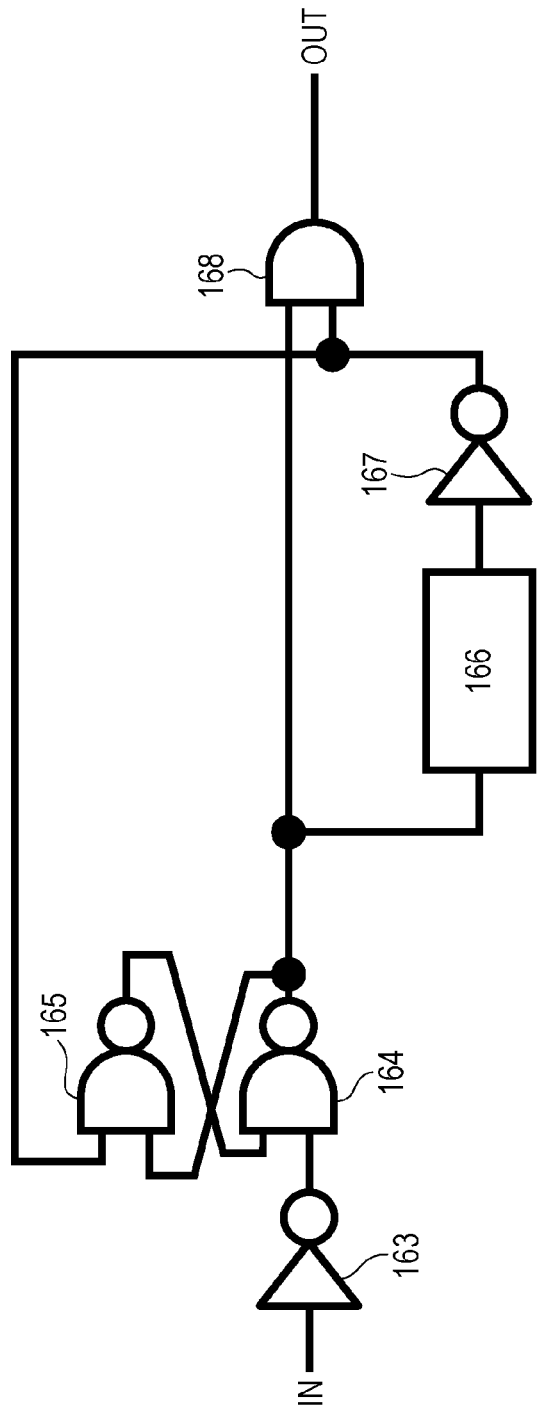
FIG. 15 is a circuit diagram illustrating an example of a configuration of a pulse latch circuit.
Figure 16:
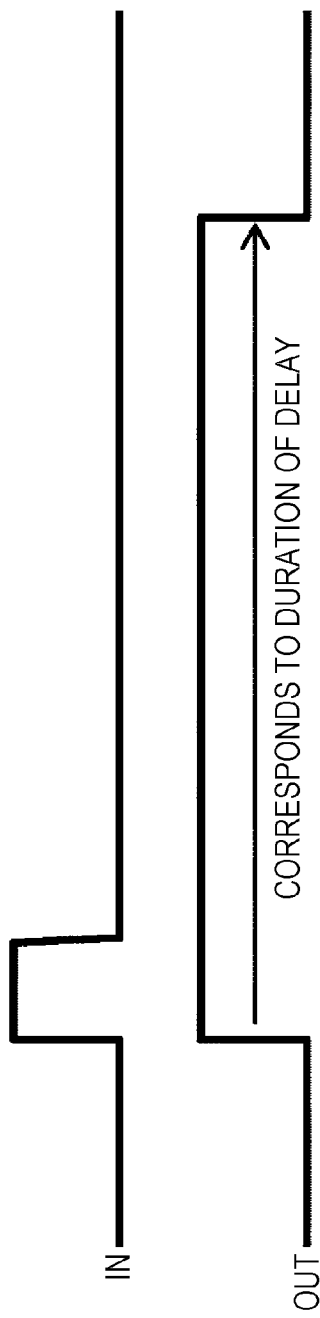
FIG. 16 is a timing chart illustrating operation of the pulse latch circuit in FIG. 15.

The pulse latch circuit 162 is inserted on the pathway that transmits the output of the comparator 124 to the gate voltage switching circuit 130. FIG. 15 illustrates an example of the configuration of the pulse latch circuit, and FIG. 16 illustrates operation of the pulse latch circuit. The pulse latch circuit 162 is made up of an inverter 163, NAND gates 164 and 165, a delay circuit 166, an inverter 167, and an AND gate 168. According to this configuration, the output OUT inverts from low level to high level when the input IN inverts from low level to high level. After that, the output OUT inverts from high level to low level after the elapsing of a fixed period determined by the characteristics of the delay circuit 166. Consequently, the pulse latch circuit 162 functions as a period detecting unit that detects the elapsing of a fixed period that starts when noise occurs.

When the capacitor 161 is provided, the output of the comparator 124 goes to high level only during the period of higher noise. In this case, a sufficient length may not be ensured for the period during which the gate-source voltage of the FET 102L is kept at the second voltage. In addition, there is also a risk of the operation of the gate voltage switching circuit 130 becoming unstable. For this reason, by providing the pulse latch circuit 162, the gate-source voltage of the FET 102L is kept at the second voltage until a fixed period elapses after the noise occurs. The length of the fixed period may be decided similarly to the third embodiment.

(Conclusion)

As described above, in the fourth embodiment, a high-pass filter is provided. Consequently, it is possible to prevent misdetection of a high likelihood of misfiring even though the likelihood of misfiring is low. Furthermore, in the fourth embodiment, a pulse latch circuit 162 is provided. Consequently, a sufficient length may be ensured for the period during which the gate-source voltage of the FET is kept at the second voltage.

Figure 17:
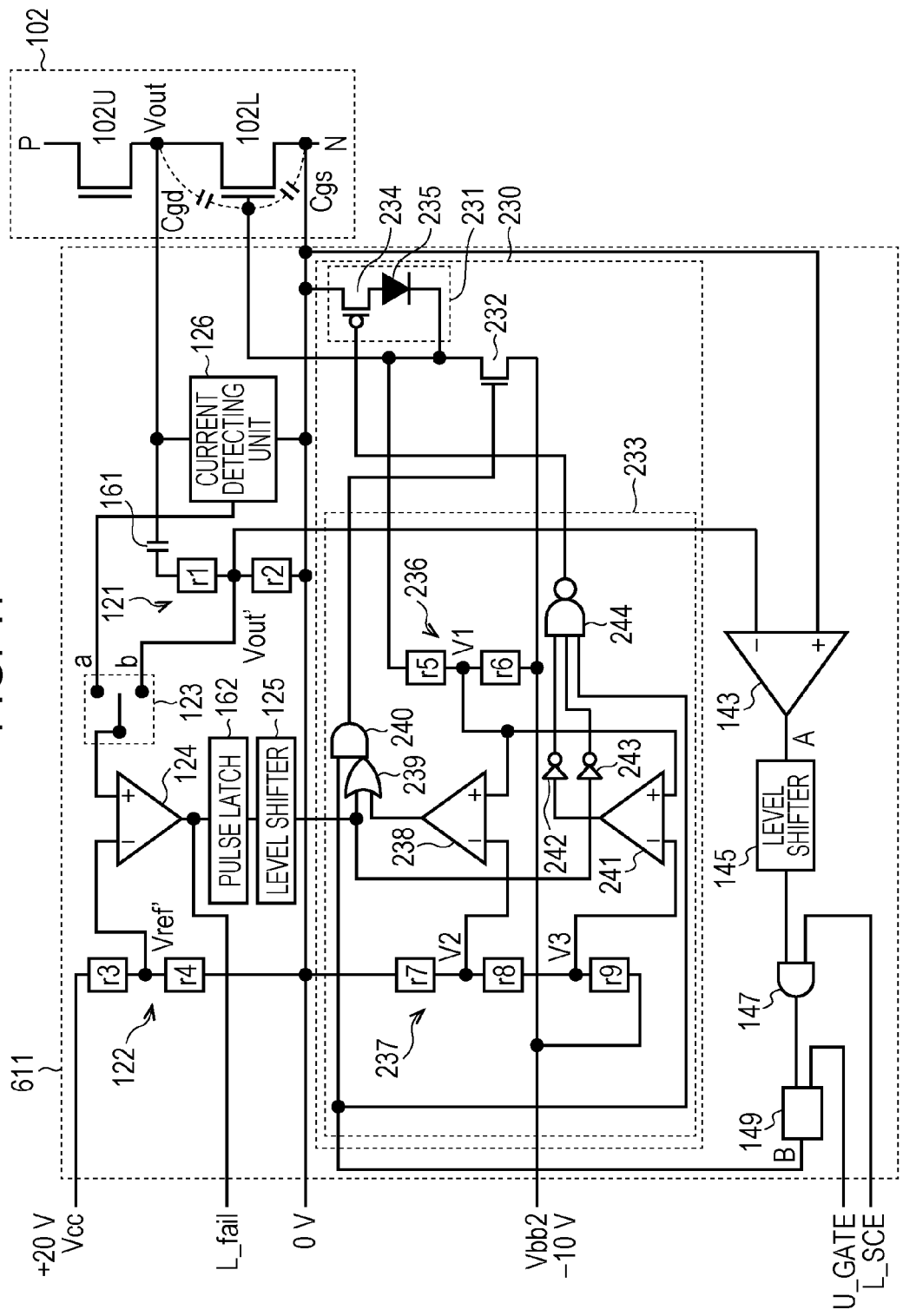
FIG. 17 is a circuit diagram illustrating a configuration of a source clamp unit of a lower arm driver according to a modification of the fourth embodiment.

The above describes the lower arm driver, but similar advantageous effects may also be obtained for the upper arm driver. In addition, similar advantageous effects may also be obtained with a configuration that adds the capacitor 161 and the pulse latch circuit 162 to the source clamp unit 211 of the second embodiment, like the source-clamp unit 611 illustrated in FIG. 17.

(Modifications)

Figure 18:
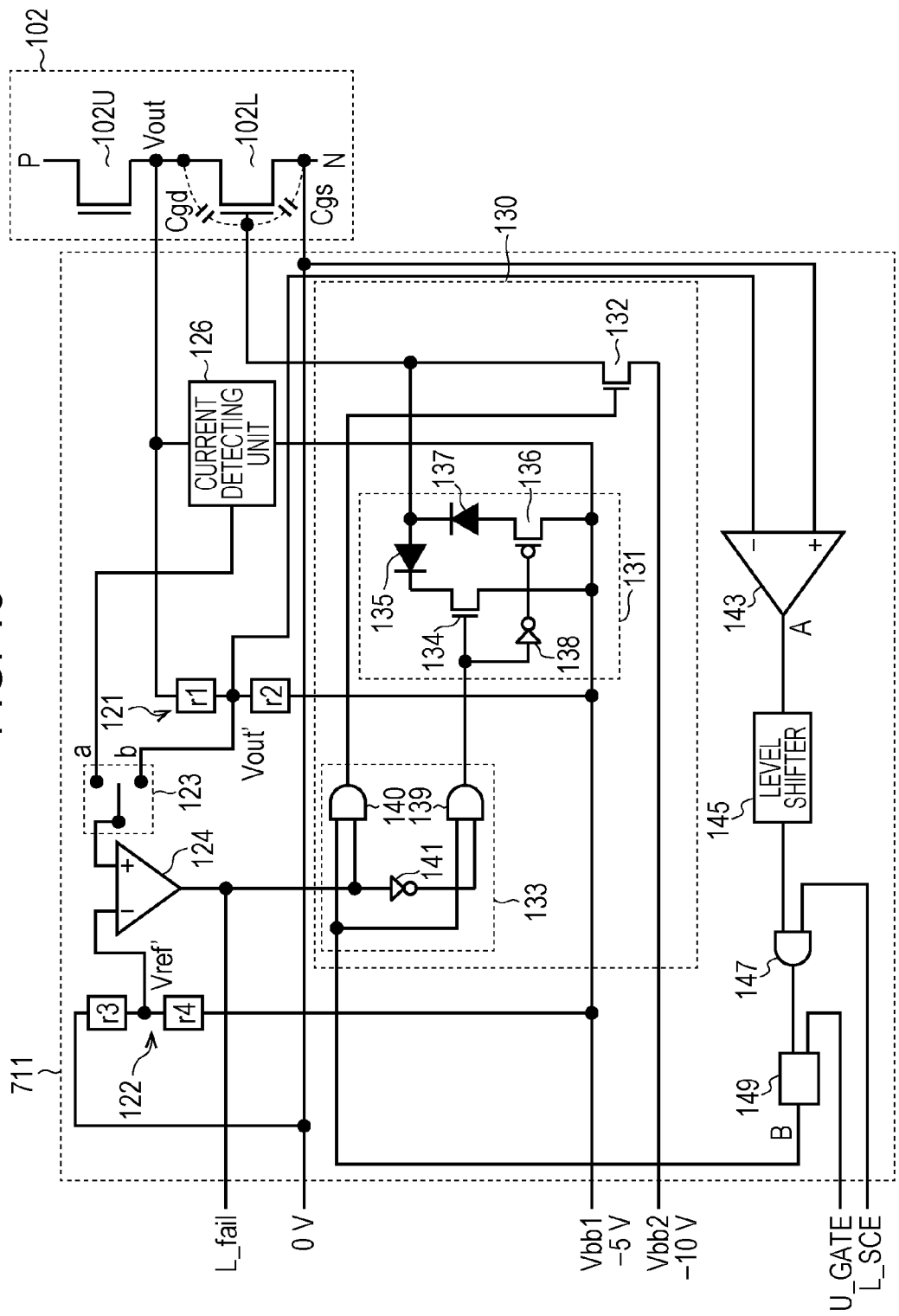
FIG. 18 is a circuit diagram illustrating a configuration of a source clamp unit of a lower arm driver according to a modification of the first embodiment.

In the foregoing embodiments, a source clamp unit is provided with a level shift circuit. For example, in the source clamp unit 111 of FIG. 2, the comparator 124 uses a +20 V positive voltage and a 0 V reference voltage as a power supply. Meanwhile, the AND gate 140 and the inverter 141 use a 0 V reference voltage and a −5 V first voltage as a power supply. For this reason, it is necessary to provide the level shift circuit 125. However, the level shift circuit may be omitted, as indicated by the source clamp unit 711 of FIG. 18. In the source clamp unit 711, the comparator 124 uses a 0 V reference voltage and a −5 V first voltage as a power supply. For this reason, the comparator 124 may be coupled directly to the AND gate 140 and the inverter 141 using a 0 V reference voltage and a −5 V first voltage as a power supply. A layout that does not include a level shift circuit may be applied similarly to the source clamp units of the other embodiments.

In the foregoing embodiments, the gate driver uses a shared control unit for the upper arm driver and the lower arm driver, but the configuration is not limited thereto. For example, control units may be provided individually for the upper arm driver and the lower arm driver.

In the foregoing embodiments, a shared comparator is used for the function of detecting the occurrence of noise and the function of detecting an overcurrent, but the configuration is not limited thereto. For example, comparators may be provided individually for each function.

In the foregoing embodiments, the gate driver drives a FET built into a bridge circuit, but the configuration is not limited thereto. For example, the gate driver may also drive a FET built into a chopper circuit.

In the foregoing embodiments, the gate driver drives a SiC-based FET, but the configuration is not limited thereto. For example, the gate driver may also drive a GaN-based FET.

In the foregoing embodiments, the positive voltage is taken to be +20 V, the first voltage to be −5 V, the second voltage to be −10 V, and the third voltage to be −5.5 V, but the configuration is not limited thereto. These voltages may be configured appropriately according to the characteristics of the FET.

Although the foregoing embodiments describe the first voltage as a negative voltage, the first voltage is not limited thereto. The first voltage may also be a positive voltage or 0, insofar as the first voltage is less than the gate threshold voltage Vth of the FET. In other words, provided that V1 is the first voltage and V2 is the second voltage, it is sufficient to satisfy the relationship Vth>V1>V2. Similarly, the third voltage may also be a positive voltage or 0, insofar as the third voltage is less than the first voltage. In other words, provided that V3 is the third voltage, it is sufficient to satisfy the relationship Vth>V1>V3>V2.

The foregoing embodiments adopt the FET of FIG. 19, but are not limited thereto. Similar advantageous effects may be obtained insofar as the conduction performance of the FET falls as the voltage applied between the gate and the source of the FET increases in negative magnitude.

A gate driver according to the present disclosure is applicable to the driving of power devices used in devices such as hybrid electric vehicles, electric vehicles, and power conditioners, for example.

What is claimed is:

1. A gate driver that drives a field-effect transistor on the basis of an input signal, comprising:
    a comparator that compares an applied voltage applied between a drain and a source of the field-effect transistor to a reference voltage for detecting noise occurring between the drain and the source of the field-effect transistor; and
    a gate voltage switching circuit that, if the input signal indicates an instruction to turn off the field-effect transistor, and the field-effect transistor is off, switches a voltage applied between a gate and the source of the field-effect transistor from a first voltage to a second voltage when the output of the comparator transitions from a state indicating that the applied voltage between the drain and the source is less than the reference voltage to a state indicating that the applied voltage between the drain and the source is equal to or greater than the reference voltage;
    wherein, provided that Vth is a threshold voltage of the field-effect transistor, V1 is the first voltage, and V2 is the second voltage,
    a relationship Vth>V1>V2 is satisfied, and additionally, the second voltage is a negative voltage.

2. The gate driver according to claim 1, wherein
    the gate voltage switching circuit additionally
    if the input signal indicates the instruction to turn off the field-effect transistor, and the field-effect transistor is off, switches the voltage applied between the gate and the source of the field-effect transistor from the second voltage to a third voltage when the output of the comparator transitions from the state indicating that the applied voltage between the drain and the source is equal to or greater than the reference voltage to the state indicating that the applied voltage between the drain and the source is less than the reference voltage, and
    provided that V3 is the third voltage,
    a relationship Vth>V3>V2 is satisfied.

3. The gate driver according to claim 2, wherein
    the third voltage is equal to the first voltage, and
    the gate voltage switching circuit includes a first switch inserted on a line joining the gate of the field-effect transistor to a first power supply that generates the first voltage, a second switch inserted on a line joining the gate of the field-effect transistor to a second power supply that generates the second voltage, and a switch control circuit that, if the input signal indicates the instruction to turn off the field-effect transistor, and the field-effect transistor is off, turns on the first switch and turns off the second switch if the output of the comparator indicates that the applied voltage between the drain and the source is less than the reference voltage, and turns off the first switch and turns on the second switch if the output of the comparator indicates that the applied voltage between the drain and the source is equal to or greater than the reference voltage.

4. The gate driver according to claim 2, wherein
the first voltage V1 and the third voltage V3 satisfy a relationship V3<V1, and
the gate voltage switching circuit includes
a first switch inserted on a line joining the gate and the source of the field-effect transistor,
a second switch inserted on a line joining the gate of the field-effect transistor to a second power supply that generates the second voltage, and
a switch control circuit that, if the input signal indicates the instruction to turn off the field-effect transistor, and the field-effect transistor is off, (a) if the output of the comparator indicates that the applied voltage between the drain and the source is less than the reference voltage, and in addition, the voltage between the gate and the source of the field-effect transistor is a more positive voltage than the first voltage, turns off the first switch and turns on the second switch, and if the output of the comparator indicates that the applied voltage between the drain and the source is less than the reference voltage, and in addition, the voltage between the gate and the source of the field-effect transistor is included in a range from the first voltage to the third voltage, turns off the first switch and turns off the second switch, (b) if the output of the comparator indicates that the applied voltage between the drain and the source is equal to or greater than the reference voltage, turns off the first switch and turns on the second switch, and (c) if the output of the comparator indicates that the applied voltage between the drain and the source is less than the reference voltage, and in addition, the voltage between the gate and the source of the field-effect transistor is included in a range from the third voltage to the second voltage, turns on the first switch and turns off the second switch.

5. The gate driver according to claim 1, further comprising:
a period detecting unit that detects whether or not a predetermined period has elapsed since the output of the comparator transitioned from the state indicating that the applied voltage between the drain and the source of the field-effect transistor is less than the reference voltage to the state indicating that the applied voltage between the drain and the source is equal to or greater than the reference voltage;
wherein the gate voltage switching circuit additionally
if the input signal indicates the instruction to turn off the field-effect transistor, and the field-effect transistor is off, switches the voltage applied between the gate and the source of the field-effect transistor from the second voltage to a third voltage when a detection result of the period detecting unit transitions from a state in which the predetermined period has not elapsed to a state in which the predetermined period has elapsed, and
provided that V3 is the third voltage,
a relationship Vth>V3>V2 is satisfied.

6. The gate driver according to claim 5, wherein
the first voltage and the third voltage are equal, and
the gate voltage switching circuit includes
a first switch inserted on a line joining the gate of the field-effect transistor to a first power supply that generates the first voltage,
a second switch inserted on a line joining the gate of the field-effect transistor to a second power supply that generates the second voltage, and
a switch control circuit that, if the input signal indicates the instruction to turn off the field-effect transistor, and the field-effect transistor is off, turns on the first switch and turns off the second switch if the output of the comparator indicates that the applied voltage between the drain and the source is less than the reference voltage, and turns off the first switch and turns on the second switch when the detection result of the period detecting unit transitions from the state in which the predetermined period has not elapsed to the state in which the predetermined period has elapsed.

7. The gate driver according to claim 5, wherein
the first voltage V1 and the third voltage V3 satisfy a relationship V3<V1, and
the gate voltage switching circuit includes
a first switch inserted on a line joining the gate and the source of the field-effect transistor,
a second switch inserted on a line joining the gate of the field-effect transistor to a second power supply that generates the second voltage, and
a switch control circuit that, if the input signal indicates the instruction to turn off the field-effect transistor, and the field-effect transistor is off, (a) if the output of the comparator indicates that the applied voltage between the drain and the source is less than the reference voltage, and in addition, the voltage between the gate and the source of the field-effect transistor is a more positive voltage than the first voltage, turns off the first switch and turns on the second switch, and if the output of the comparator indicates that the applied voltage between the drain and the source is less than the reference voltage, and in addition, the voltage between the gate and the source of the field-effect transistor is included in a range from the first voltage to the third voltage, turns off the first switch and turns off the second switch, (b) if the detection result of the period detecting unit indicates the state in which the predetermined period has not elapsed, turns off the first switch and turns on the second switch, and (c) if the detection result of the period detecting unit indicates the state in which the predetermined period has elapsed, and in addition, the voltage between the gate and the source of the field-effect transistor is included in a range from the third voltage to the second voltage, turns on the first switch and turns off the second switch.

8. The gate driver according to claim 1, further comprising:
a high-pass filter, inserted on a pathway that transmits the applied voltage between the drain and the source of the field-effect transistor from the field-effect transistor to the comparator, that transmits the applied voltage between the drain and the source of the field-effect transistor to the comparator only if a time rate of change of the applied voltage between the drain and the source of the field-effect transistor is equal to or greater than a predetermined value.

9. The gate driver according to claim 8, further comprising:
a period detecting unit that detects whether or not a predetermined period has elapsed since the output of the comparator transitioned from the state indicating that the applied voltage between the drain and the source of the field-effect transistor is less than the reference voltage to the state indicating that the applied voltage between the drain and the source is equal to or greater than the reference voltage;
wherein the gate voltage switching circuit additionally
if the input signal indicates an instruction to turn off the field-effect transistor, and the field-effect transistor is off, switches the voltage applied between the gate and the source of the field-effect transistor from the second voltage to a third voltage when a detection result of the period detecting unit transitions from a state in which the predetermined period has not elapsed to a state in which the predetermined period has elapsed, and
provided that V3 is the third voltage,
a relationship Vth>V3>V2 is satisfied.

10. The gate driver according to claim 1, further comprising:
a current detecting unit that detects a drain current of the field-effect transistor; and
a switch, inserted on a pathway that transmits the applied voltage between the drain and the source of the field-effect transistor from the field-effect transistor to the comparator, that transmits the applied voltage between the drain and the source of the field-effect transistor to the comparator if the field-effect transistor is off, and transmits a detection result of the current detecting unit to the comparator if the field-effect transistor is on.

11. A power module, comprising:
the gate driver according to claim 1; and
the field-effect transistor.

12. The power module according to claim 11, wherein
the field-effect transistor is provided with a channel layer, and
the field-effect transistor functions as a diode that allows current to flow from the source to the drain via the channel layer when a negative voltage is applied between the drain and the source while a negative voltage is being applied between the gate and the source.

* * * * *